United States Patent
Cha et al.

(10) Patent No.: US 11,074,127 B1
(45) Date of Patent: Jul. 27, 2021

(54) SEMICONDUCTOR MEMORY DEVICES AND METHODS OF OPERATING SEMICONDUCTOR MEMORY DEVICES

(71) Applicant: SAMSUNG ELECTRONICS CO., LTD., Suwon-si (KR)

(72) Inventors: Sanguhn Cha, Suwon-si (KR); Juseong Hwang, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/860,241

(22) Filed: Apr. 28, 2020

(30) Foreign Application Priority Data

Jan. 7, 2020 (KR) .................. 10-2020-0002000

(51) Int. Cl.
*G06F 11/10* (2006.01)
*G11C 11/406* (2006.01)
*G06F 11/07* (2006.01)

(52) U.S. Cl.
CPC ...... *G06F 11/1068* (2013.01); *G06F 11/0772* (2013.01); *G06F 11/106* (2013.01); *G06F 11/1016* (2013.01); *G06F 11/1044* (2013.01); *G11C 11/40607* (2013.01)

(58) Field of Classification Search
CPC ............. G06F 11/1068; G06F 11/0772; G06F 11/1016; G06F 11/1044; G06F 11/106; G11C 11/40607
USPC .......................... 714/763, 764, 768, 773, 799
See application file for complete search history.

(56) References Cited

U.S. PATENT DOCUMENTS

| | | | |
|---|---|---|---|
| 6,480,982 B1 | 11/2002 | Chan et al. | |
| 9,087,614 B2 | 7/2015 | Son et al. | |
| 9,170,639 B2 | 10/2015 | Henderson et al. | |
| 9,600,362 B2 | 3/2017 | Kang et al. | |
| 10,037,244 B2* | 7/2018 | Chung | G06F 11/1068 |
| 10,042,700 B2 | 8/2018 | Brandl | |
| 10,319,462 B2 | 6/2019 | Lee et al. | |
| 2007/0022244 A1 | 1/2007 | Kimmery | |

(Continued)

FOREIGN PATENT DOCUMENTS

JP 8-194648 A 7/1996

OTHER PUBLICATIONS

Yu et al., A Hybrid ECC and Redundancy Technique for Reducing Refresh Power of DRAM, 2013, IEEE, pp. 1-6. (Year: 2013).*

*Primary Examiner* — John J Tabone, Jr.
(74) *Attorney, Agent, or Firm* — Sughrue Mion, PLLC

(57) ABSTRACT

A semiconductor memory device includes an ECC circuit; an error information register; a scrubbing control circuit to count refresh row addresses and output a scrubbing address for a scrubbing operation to be performed on at least one sub-page in a first memory cell row each time N refresh row addresses are counted; and a control logic circuit configured to: control the ECC circuit to sequentially read data corresponding to a first codeword, perform error detection on the first codeword, and provide error information based on the error detection, the error information indicating an error occurrence count in the first codeword; and record the error information in the error information register and selectively determine, based on the error information, whether to write back a corrected first codeword in a memory location in which the data corresponding to the first codeword is stored.

20 Claims, 22 Drawing Sheets

(56) References Cited

U.S. PATENT DOCUMENTS

| | | | |
|---|---|---|---|
| 2011/0289385 A1* | 11/2011 | Takeuchi | G06F 11/1068 |
| | | | 714/764 |
| 2017/0139771 A1* | 5/2017 | Chung | G06F 3/064 |
| 2019/0172545 A1 | 6/2019 | Li et al. | |
| 2019/0229753 A1* | 7/2019 | Cha | G06F 11/1048 |
| 2019/0243708 A1 | 8/2019 | Cha et al. | |
| 2019/0371391 A1* | 12/2019 | Cha | G06F 11/1016 |

* cited by examiner

| | ADDINF (BGA,BA,RA) | ECNT | FCWCNT | RWF |
|---|---|---|---|---|
| Idx11 | A | 2 | 2 | 0 |
| Idx12 | B | 4 | 3 | 1 |
| ⋮ | ⋮ | ⋮ | ⋮ | ⋮ |
| Idx1u | X | 1 | 1 | 0 |

581

582  583  584  585

| | ADDINF | FCWADD | FG |
|---|---|---|---|
| | BGA,BA,RA | | |
| Idx21 | A | FCA1 | 0 |
| Idx22 | A | FCA2 | 0 |
| Idx23 | B | FCA3 | 1 |
| ⋮ | ⋮ | ⋮ | ⋮ |
| Idx2v | X | FCAv | 0 |

586

587  588  589

SEMICONDUCTOR MEMORY DEVICES AND METHODS OF OPERATING SEMICONDUCTOR MEMORY DEVICES

CROSS-REFERENCE TO THE RELATED APPLICATIONS

This application claims priority from Korean Patent Application No. 10-2020-0002000, filed on Jan. 7, 2020 in the Korean Intellectual Property Office, the disclosure of which is incorporated herein by reference in its entirety.

BACKGROUND

1. Field

Apparatuses and methods consistent with example embodiments relate to memories, and more particularly to semiconductor memory devices, and methods of operating semiconductor memory devices.

2. Related Art

Semiconductor memory devices may be classified into non-volatile memory devices, such as flash memory devices, and volatile memory devices such as DRAMs. High speed operation and cost efficiency of DRAMs make it possible for DRAMs to be used for system memories. Due to the continuing size constraints in fabrication design rule of DRAMs, bit errors of memory cells in the DRAMs may rapidly increase and yield of the DRAMs may decrease. Therefore, there is a need for increased semiconductor memory device credibility.

SUMMARY

One or more example embodiments provide a semiconductor memory device with increased credibility and performance.

One or more example embodiments provide a method of operating a semiconductor memory device, with increased credibility and performance.

According to example embodiments, a semiconductor memory device includes a memory cell array including a plurality of memory cell rows, each of which includes volatile memory cells; an error correction code (ECC) circuit; an error information register; a scrubbing control circuit configured to count refresh row addresses and output a scrubbing address to control a scrubbing operation to be performed on at least one sub-page in a first memory cell row of the plurality of memory cell rows each time the scrubbing control circuit counts N refresh row addresses, N being an integer greater than two; and a control logic circuit configured to: control the ECC circuit to sequentially read data corresponding to a first codeword from M sub-pages in the first memory cell row, perform error detection on the first codeword, and provide error information based on the error detection, the error information indicating an error occurrence count in the first codeword, M being an integer greater than one; and record the error information in the error information register and selectively determine, based on the error information, whether to write back a corrected first codeword in a memory location in which the data corresponding to the first codeword is stored.

According to example embodiments, there is provided method of operating a semiconductor memory device including a memory cell array that includes a plurality of memory cell rows, each of which includes a plurality of volatile memory cells, the method including: generating first addresses sequentially based on a first command received from an external device; sequentially performing a refresh operation on the plurality of memory cell rows based on the first addresses; selecting a first memory cell row corresponding to a second address, of the plurality of memory cell rows each time the refresh operation is performed N times, N being an integer greater than two, the second address being generated in the semiconductor memory device; performing, in an error correction code (ECC) circuit of the semiconductor memory device, an ECC decoding on codewords in the first memory cell row M times to detect an error bit, M being an integer greater than one; generating, in the ECC circuit, a corrected codeword based on a codeword including a correctable error bit; and writing back the corrected codeword in a memory location corresponding to the codeword including the correctable error bit.

According to example embodiments, a semiconductor memory device a semiconductor memory device includes a memory cell array including a plurality of memory cell rows, each of which includes volatile memory cells; an error correction code (ECC) circuit; an error information register; a refresh control circuit configured to generate refresh row addresses indicating memory cell rows based on a first command received from an external device; a scrubbing control circuit configured to count the refresh row addresses and output a scrubbing address to control a scrubbing operation to be performed on at least one sub-page in a first memory cell row of the plurality of memory cell rows each time the scrubbing control circuit counts N refresh row addresses, N being an integer greater than two; and a control logic circuit configured to: control the ECC circuit to sequentially read data corresponding to a first codeword from M sub-pages in the first memory cell row, perform error detection on the first codeword, and provide an error information based on the error detection, the error information indicating an error occurrence count in the first codeword, M being an integer greater than one; and record the error information in the error information register and selectively determine, based on the error information, whether to write back a corrected first codeword in a memory location in which the data corresponding to the first codeword is stored.

Accordingly, a semiconductor memory device includes an ECC circuit, a scrubbing control circuit, an error information register and a control logic circuit. The ECC circuit sequentially performs error detection operations on M codewords in a memory cell row and writes back some codewords based on the error information while a refresh operation is performed on another memory cell row. Therefore, the semiconductor memory device may reduce scrubbing period because write-back operation is selectively performed based on whether a codeword includes correctable error bit.

BRIEF DESCRIPTION OF THE DRAWINGS

The above and other aspects and features will become more apparent by describing in detail example embodiments with reference to the accompanying drawings, in which:

FIG. 18 illustrates the error information register in the semiconductor memory device of FIG. 2 according to example embodiments.

DETAILED DESCRIPTION

Example embodiments will be described more fully hereinafter with reference to the accompanying drawings.

Figure 1:
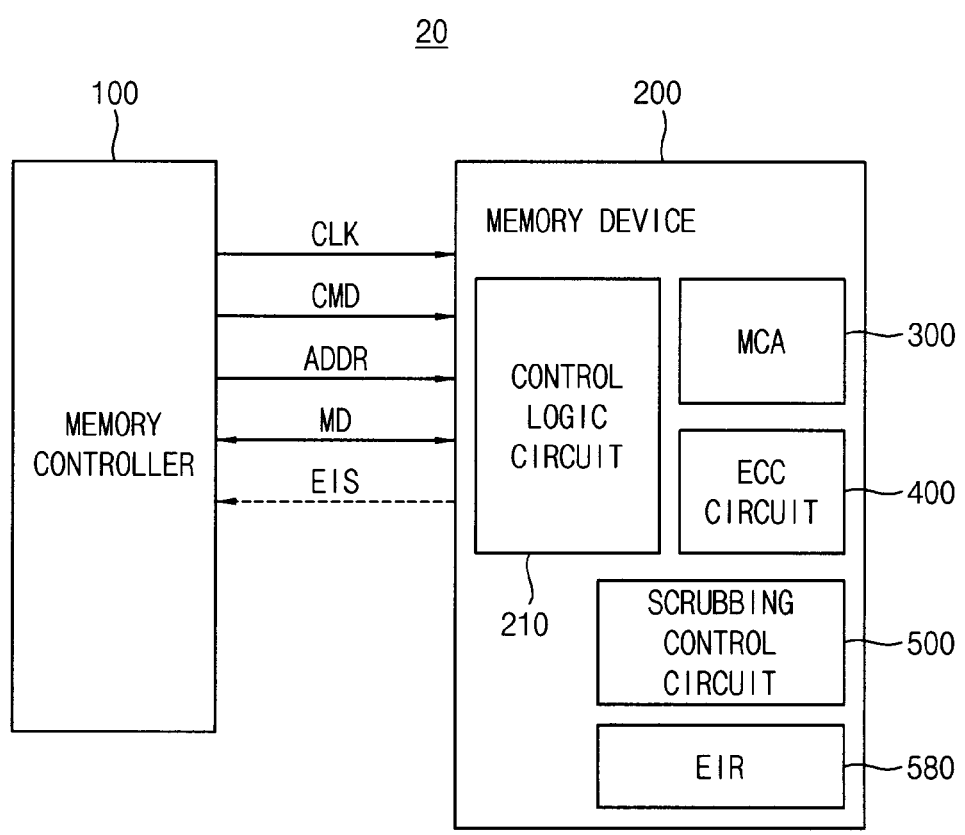
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), double data rate 5 (DDR5) SDRAM a low power DDR4 (LPDDR4) SDRAM, a low power DDR5 (LPDDR5) SDRAM or a low power DDR6 (LPDDDR6) DRAM.

The memory controller 100 transmits a clock signal CLK, a command CMD, and an address (signal) ADDR to the semiconductor memory device 200 and exchanges main data MD with the semiconductor memory device 200.

The semiconductor memory device 200 includes a memory cell array 300 that stores the main data MD and parity data, an error correction code (ECC) circuit 400, a control logic circuit 210, a scrubbing control circuit 500 and error information register 580.

The ECC circuit 400 may perform ECC encoding on a write data to be stored in a target page of the memory cell array 300, and may perform ECC decoding or decoding on a codeword read from the target page under control of the control logic circuit 210.

The scrubbing control circuit 500 may generate scrubbing addresses such that a scrubbing operation is performed on a first memory cell row of a plurality of memory cell rows whenever a refresh operation is performed on N memory cell rows as the refresh operation is performed on the plurality of memory cell rows included in the memory cell array 300. Here, N is a natural number greater than two. The control logic circuit 210 may control the ECC circuit 400 such that the ECC circuit 400 ECC circuit sequentially reads data corresponding to a first codeword, from M sub-pages, designated by the scrubbing address, in the first memory cell row, and performs error detection on the first codeword read from each of the M sub-pages to generate an error generation signal in response to error being detected in the first codeword. For example, the refresh operation may be sequentially performed on the plurality of memory cell rows, and after N rows have been refreshed, the scrubbing control circuit 500 may generate scrubbing addresses such that the scrubbing operation is performed on the first memory cell row. Subsequently, as the refresh operation continues and another N rows have been refreshed, the scrubbing control circuit 500 may generate scrubbing addresses such that the scrubbing operation is performed on a first memory cell row of the plurality of memory cell rows. For example, if N=5, as refresh operations are sequentially performed on 100 memory cell rows, the scrubbing operation is performed 20 times.

The control logic circuit 210 records error information in the error information register 580 and selectively determines whether to write back a corrected first codeword in a memory location in which the data is stored, based on the error information. The error information including error occurrence count in the first codewords. The control logic circuit 210 may control the ECC circuit 400 based on the error information such that the ECC circuit 400 writes back the corrected first codeword in the memory location in response to the first codeword including a correctable error bit which is to be corrected by the ECC circuit 400. In an example embodiment, the control logic circuit 210 controls the error information register 580 to provide the error information to the memory controller 100 as error information signal EIS.

Figure 2:
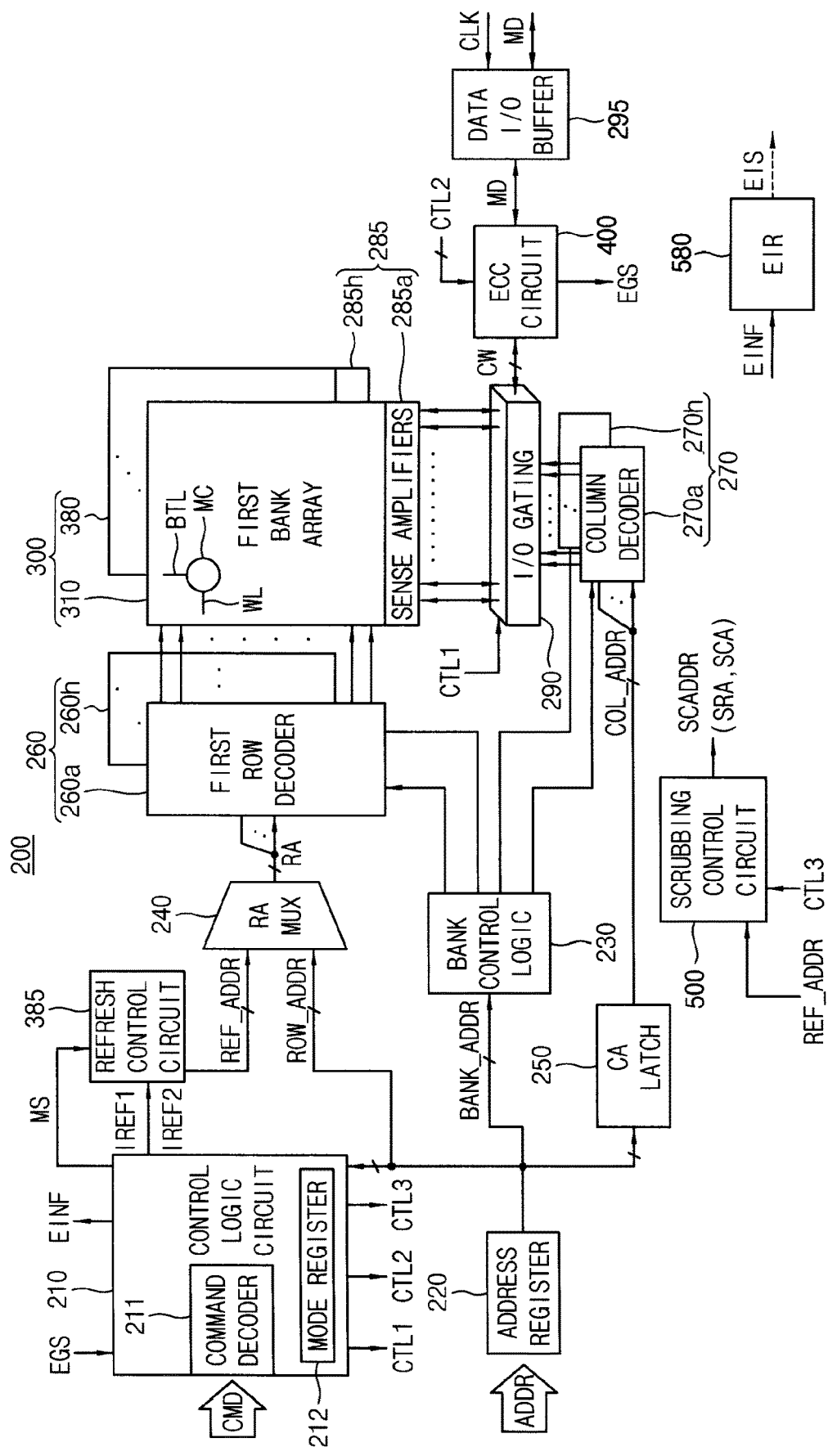
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 includes the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an I/O gating circuit 290, the ECC circuit 400, the scrubbing control circuit 500, and a data I/O buffer 295.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh control circuit 385. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The refresh control circuit 385 may sequentially change and output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 385 when the control logic circuit 210 receives the auto refresh command. When the command CMD from the memory controller 100 corresponds to a self-refresh entry command, the control logic circuit 210 may apply the second refresh control signal IREF2 to the refresh control circuit 385 and the second refresh control signal IREF2 may be activated from a time point when the control logic circuit 210 receives the self-refresh entry command to a time point when control logic circuit 210 receives a self-refresh exit command. The refresh control circuit 385 may sequentially increase or decrease the refresh row address REF_ADDR in response to receiving the first refresh control signal IREF1 or while the second refresh control signal IREF2 is activated.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some embodiments, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h activates a sense amplifier corresponding to the bank address BANK_ADDR and the column address COL_ADDR through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC circuit 400.

Main data MD to be written in one bank array of the first through eighth bank arrays 310~380 may be provided to the data I/O buffer 295 from the memory controller 100. The ECC circuit 400 may perform an ECC encoding on the main data MD to generate parity data, the ECC circuit 400 may provide the main data MD and the parity data to the I/O gating circuit 290 and the I/O gating circuit 290 may write the main data MD and the parity data in a sub-page of the target page in one bank array through the write drivers.

The data I/O buffer 295 may provide the main data MD from the memory controller 100 to the ECC circuit 400 in a write operation of the semiconductor memory device 200, based on the clock signal CLK and may provide the main data MD from the ECC circuit 400 to the memory controller 100 in a read operation of the semiconductor memory device 200.

The ECC circuit 400 performs an ECC decoding on a codeword read from a sub-page of the target page and may provide an error generation signal EGS to the control logic circuit 210 when correcting at least one error bit when the at least one error bit is detected in the main data in the codeword.

The scrubbing control circuit 500 may count, as the refresh row address REF_ADDR sequentially changes, and may output a normal scrubbing address SCADDR whenever the scrubbing control circuit 500 counts N refresh row addresses. The normal scrubbing address SCADDR may include a scrubbing row address SRA and a scrubbing column address SCA. The scrubbing control circuit 500 may provide the scrubbing row address SRA and the scrubbing column address SCA to the row decoder 260 and the column decoder 270.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC circuit 400, and a third control signal CTL3 to control the scrubbing control circuit 500. In addition, the control logic circuit 210 may provide the refresh control circuit 385 with a mode signal MS associated with a refresh period. The control logic circuit 210 may generate the mode signal MS based on a temperature signal representing an operating temperature of the semiconductor memory device 200.

Figure 3:
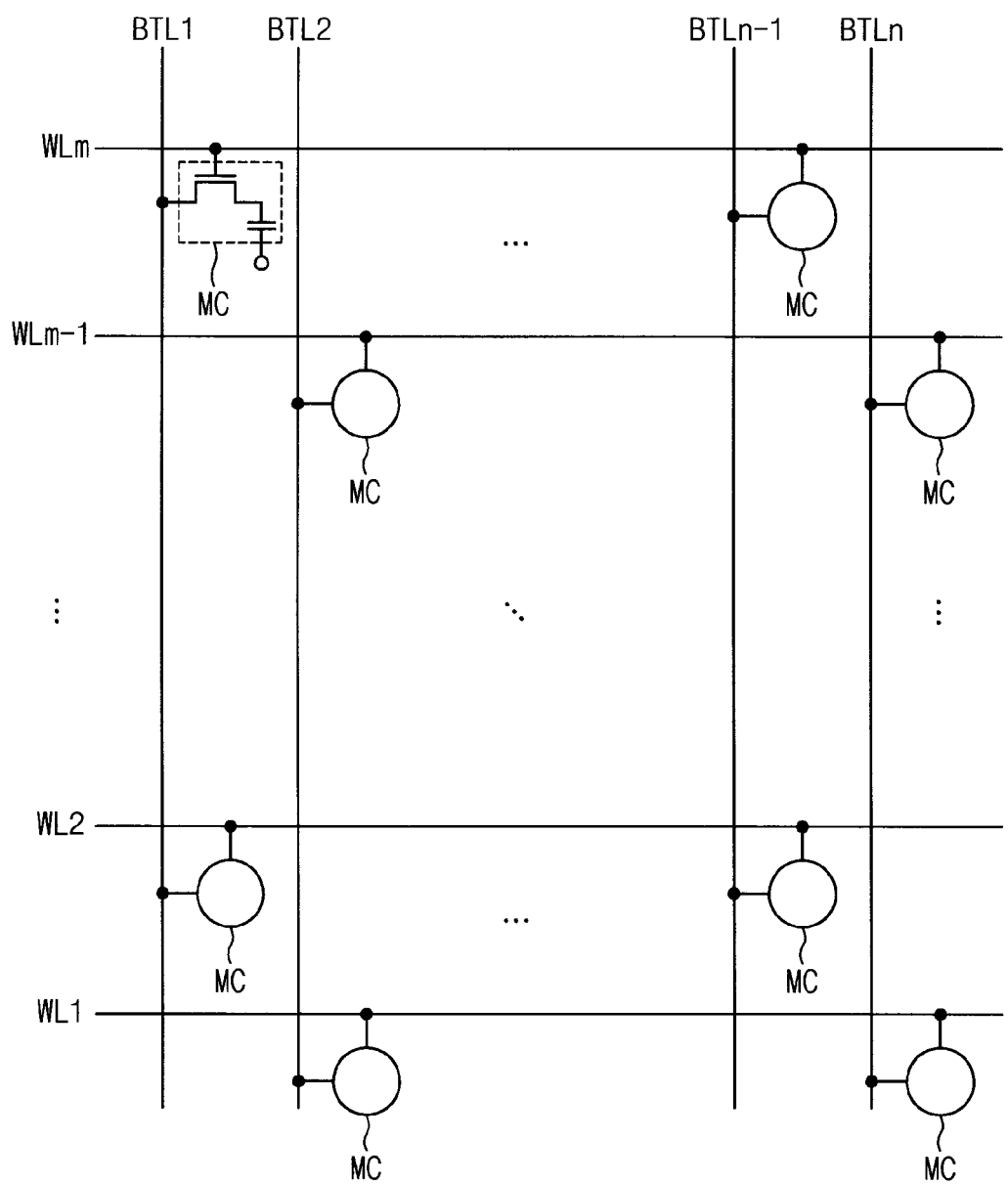
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WLm (m is a natural number greater than two), a plurality of bit-lines BTL1~BTLn (n is a natural number greater than two), and a plurality of volatile memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor.

Figure 4:
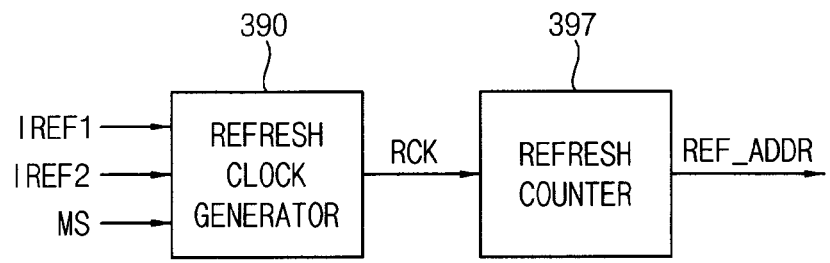
FIG. 4 is a block diagram illustrating the refresh control circuit in the semiconductor memory device of FIG. 2 according to example embodiments.

FIG. 4 is a block diagram illustrating the refresh control circuit in the semiconductor memory device of FIG. 2 according to example embodiments.

Referring to FIG. 4, the refresh control circuit 385 may include a refresh clock generator 390 and a refresh counter 397.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or while the second refresh control signal IREF2 is activated.

The refresh counter 397 may generate the refresh row address REF_ADDR sequentially designating the memory cell rows by performing counting operation at the period of the refresh clock signal RCK.

Figure 5:
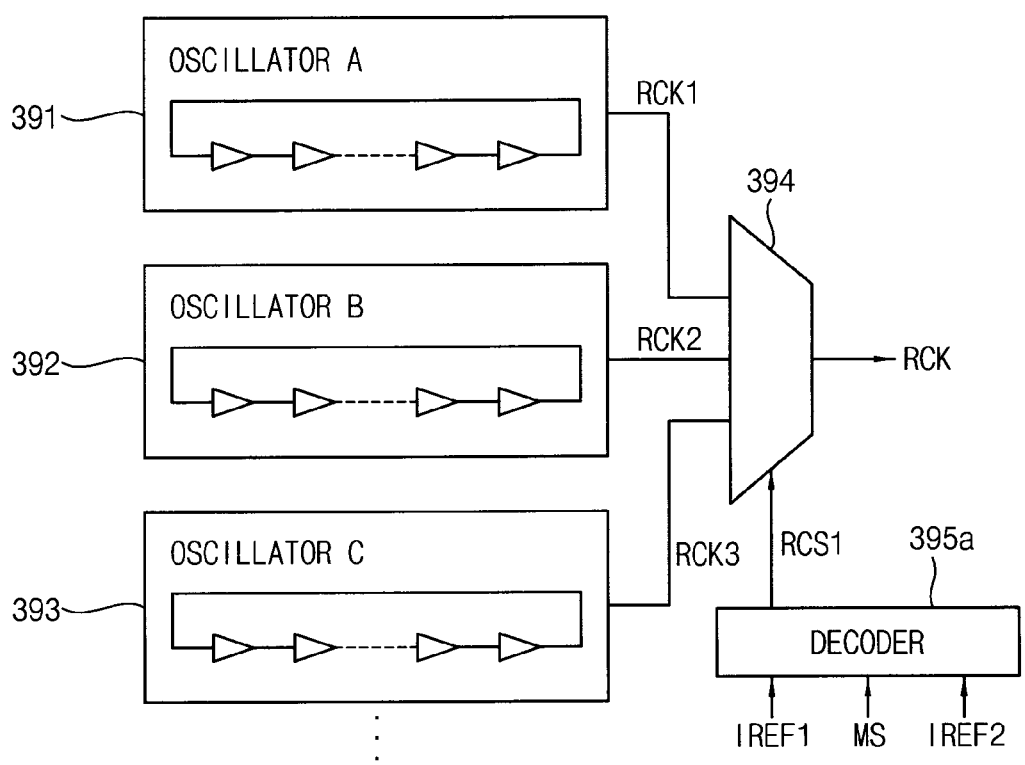
FIG. 5 is a circuit diagram illustrating an example of the refresh clock generator shown in FIG. 4 according to example embodiments.

FIG. 5 is a circuit diagram illustrating an example of the refresh clock generator shown in FIG. 4 according to example embodiments.

Referring to FIG. 5, a refresh clock generator 390a may include a plurality of oscillators 391, 392 and 393, a multiplexer 394 and a decoder 395a. The decoder 395a may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods. The multiplexer 394 selects one of the refresh clock signals RCK1, RCK2 and RCK3 to provide the refresh clock signal RCK in response to the clock control signal RCS1.

Figure 6:
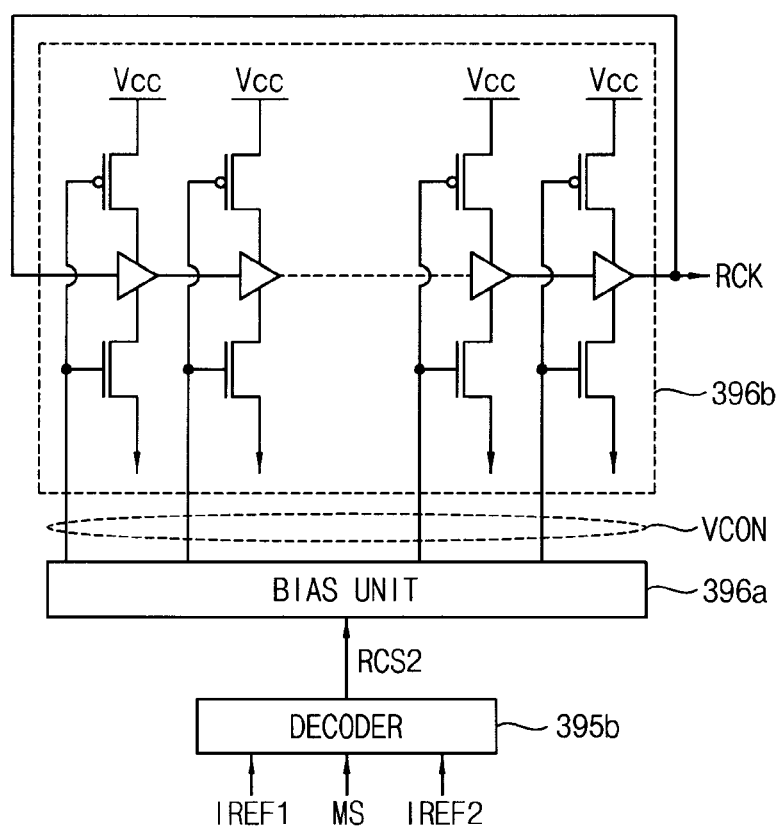
FIG. 6 is a circuit diagram illustrating another example of the refresh clock generator in FIG. 4 according to example embodiments.

FIG. 6 is a circuit diagram illustrating another example of the refresh clock generator in FIG. 4 according to example embodiments.

Referring to FIG. 6, a refresh clock generator 390b may include a decoder 395b, a bias unit 396a and an oscillator 396b. The decoder 395b may decode the first refresh control signal IREF1, the second refresh control signal IREF2 and the mode signal MS to output a clock control signal RCS2. The bias unit 396a generates a control voltage VCON in response to the clock control signal RCS2. The oscillator 396b generates the refresh pulse signal RCK having a variable period, according to the control voltage VCON.

Figure 7:
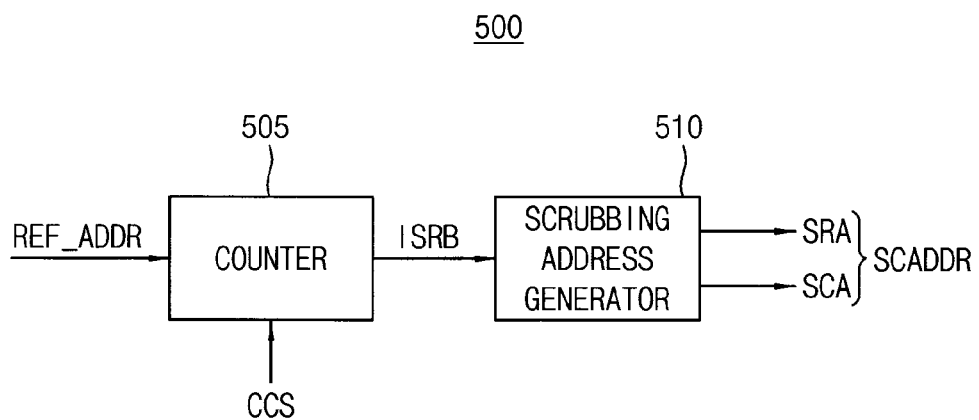
FIG. 7 is a block illustrating an example of the scrubbing control circuit in the semiconductor memory device of FIG. 2 according to example embodiments.

FIG. 7 is a block illustrating an example of the scrubbing control circuit in the semiconductor memory device of FIG. 2 according to example embodiments.

Referring to FIG. 7, the scrubbing control circuit 500 may include a counter 505, and a scrubbing address generator 510.

The counter 505 counts the refresh row address REF_ADDR and generates an internal scrubbing signal ISRB which is activated during a first interval when the counter 505 counts the refresh row address REF_ADDR a number of times designated by a counting control signal CCS. The first interval may correspond to a time interval for refreshing one memory cell row. For example, the counter 505 may count each time the refresh row address REF_ADDR is provided or changes as the refresh operation is sequentially performed.

The scrubbing address generator 510 generates a normal scrubbing address SCADDR associated with a normal scrubbing operation for codewords in each of the memory cell rows, which gradually changes in the first scrubbing mode, in response to the internal scrubbing signal ISRB.

The normal scrubbing address SCADDR includes a scrubbing row address SRA and a scrubbing column address SCA. The scrubbing row address SRA designates one page in one bank array and the scrubbing column address SCA designates one of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords included in the memory cell array 300.

Figure 8:
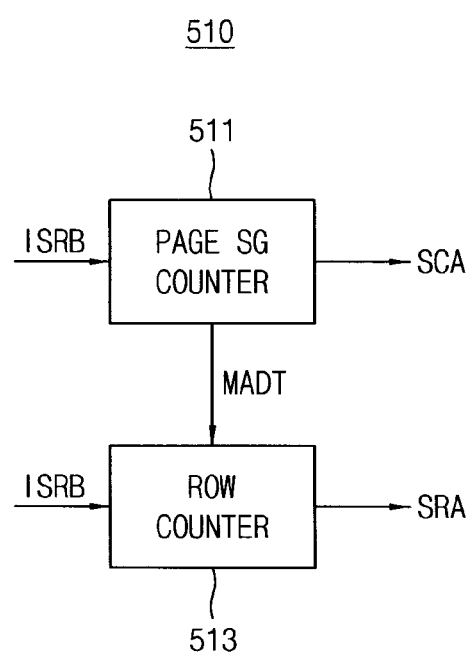
FIG. 8 is a block diagram illustrating the scrubbing address generator in the scrubbing control circuit of FIG. 7 according to example embodiments.

FIG. 8 is a block diagram illustrating the scrubbing address generator in the scrubbing control circuit of FIG. 7 according to example embodiments.

Referring to FIG. 8, the scrubbing address generator 510 may include a page segment counter 511 and a row counter 513.

The page segment counter 511 increases the scrubbing column address SCA by one when the internal scrubbing signal ISRB is activated, and actives a maximum address detection signal MADT and resets whenever the scrubbing column address SCA reaches its maximum value. The page segment counter 511 provides the maximum address detection signal MADT to the row counter 513.

The row counter 513 starts counting operation when initially receiving the internal scrubbing signal ISRB and increases the scrubbing row address SRA by one whenever the activated maximum address detection signal MADT is received. Because the internal scrubbing signal ISRB is activated during the first interval while a refresh operation is performed on one memory cell row, the page segment counter 511 may generate the scrubbing column address SCA associated with codewords in one page during the first interval.

Figure 9:
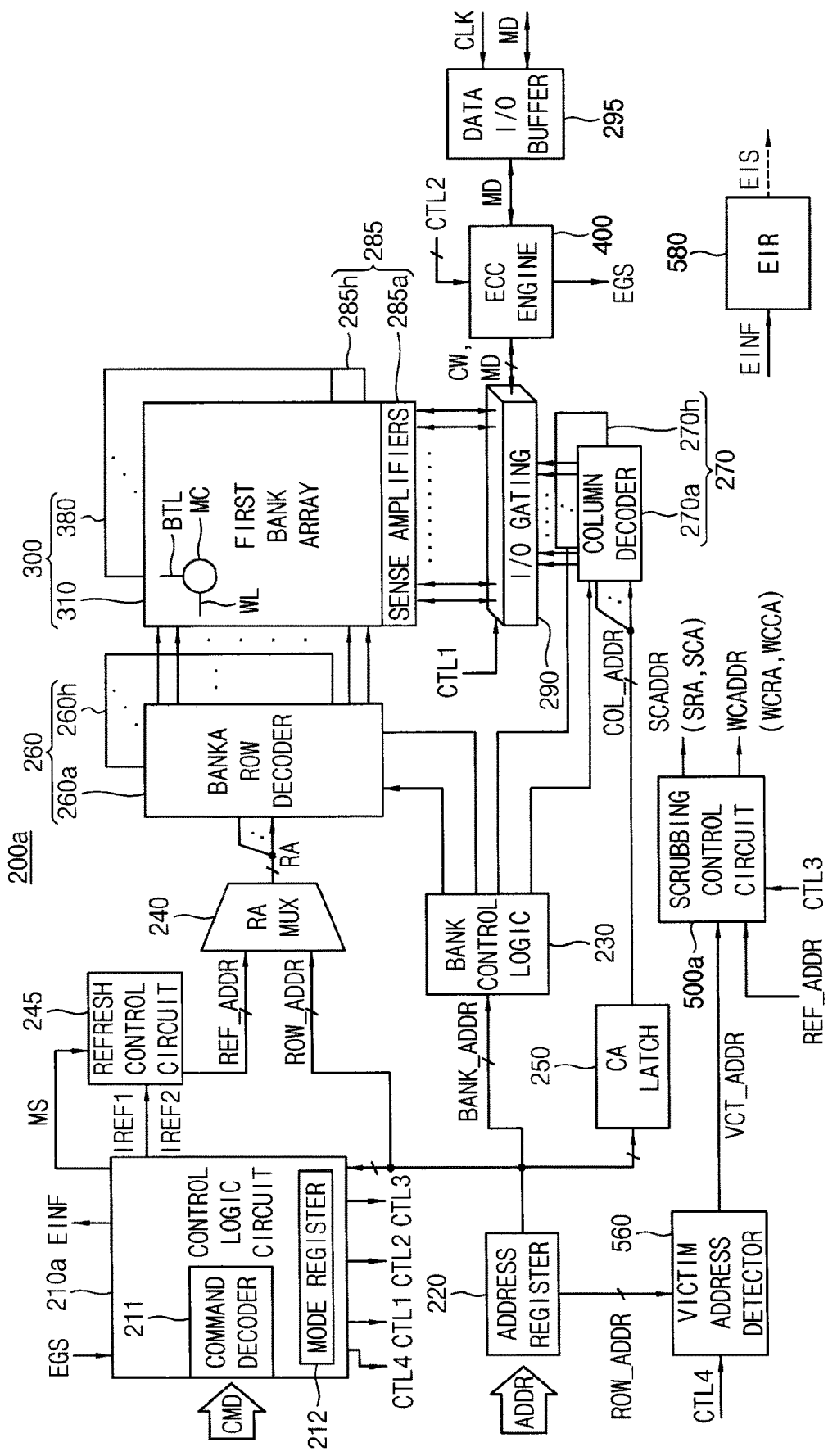
FIG. 9 is a block diagram illustrating another example of the semiconductor memory device in FIG. 1 according to example embodiments.

FIG. 9 is a block diagram illustrating another example of the semiconductor memory device in FIG. 1 according to example embodiments.

A semiconductor memory device 200a of FIG. 9 differs from the semiconductor memory device 200 of FIG. 2 in that the semiconductor memory device 200a further includes a victim address detector 560 and a scrubbing control circuit 500a outputs a weak codeword address WCADDR in a second scrubbing mode.

Referring to FIG. 9, a control logic circuit 210a may further generate a fourth control signal CTL4 for controlling the victim address detector 560.

The victim address detector 560 may count a number of accesses to a first memory region in the memory cell array 300 to generate at least one victim address VCT_ADDR designating at least one adjacent memory region adjacent to the first memory region when the number of the counted accesses reaches the reference number of times during a reference interval. The victim address VCT_ADDR may be stored in an address storing table of the scrubbing control circuit 500a.

The scrubbing control circuit 500a may provide the scrubbing row address SRA and the scrubbing column address SCA to the row decoder 260 and the column decoder 270, respectively in a first scrubbing mode. The scrubbing control circuit 500a, in a second scrubbing mode, may output an address of codeword associated with the victim address VCT_ADDR stored in the address storing table as the weak codeword address WCADDR. The weak codeword address WCADDR may include a weak codeword row address WCRA and a weak codeword column address WCCA. The scrubbing control circuit 500a may provide the weak codeword row address WCRA and the weak codeword column address WCCA to the row decoder 260 and the column decoder 270, respectively in the second scrubbing mode.

Figure 10:
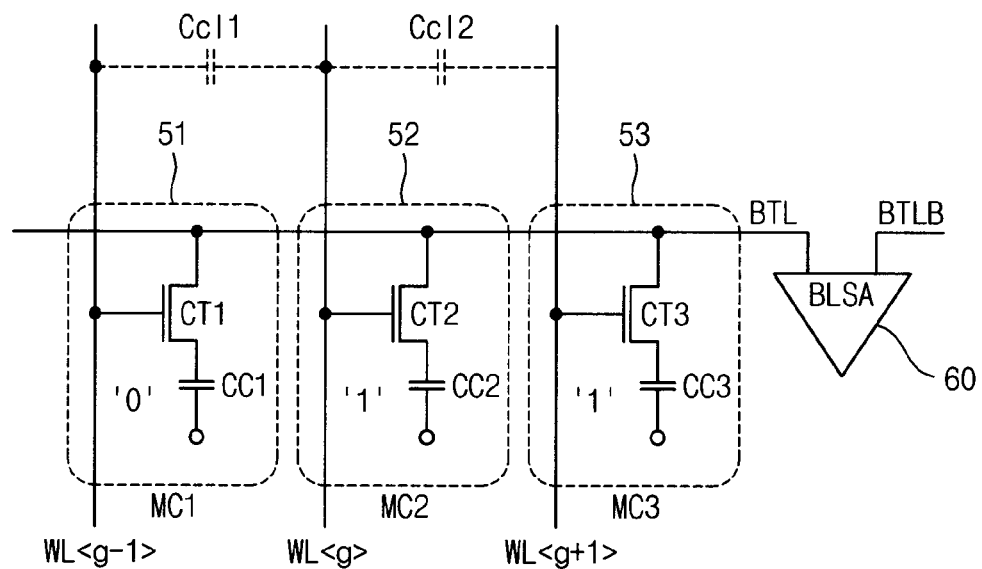
FIG. 10 is a circuit diagram illustrating disturbance between memory cells of a semiconductor memory device.

FIG. 10 is a circuit diagram illustrating disturbance between memory cells of a semiconductor memory device.

Referring to FIG. 10, a part of the semiconductor memory device 200a includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<g−1>, the memory cell 52 is connected to a word-line WL<g>, and the memory cell 53 is connected to a word-line WL<g+1>. As shown in FIG. 10, the word-lines WL<g−1> and WL<g+1> are located adjacent to the word-line WL<g>. The memory cell 51 includes an access transistor CT1 and a cell capacitor CC1. A gate terminal of the access transistor CT1 is connected to the word-line WL<g−1> and its one terminal is connected to the bit-line BTL. The memory cell 52 includes an access transistor CT2 and a cell capacitor CC2. A gate terminal of the access transistor CT2 is connected to the word-line WL<g> and its one terminal is connected to the bit-line BTL. Also, the memory cell 53 includes an access transistor CT3 and a cell capacitor CC3. A gate terminal of the access transistor ST3 is connected to the word-line WL<g+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<g>. Then, due to a capacitive coupling effect, a voltage of adjacent word-lines WL<g−1> and WL<g+1> rises even when no select voltage is applied. Such capacitive coupling is indicated with parasitic capacitances CcI1 and CcI2.

While no refresh operation is performed and the word-line WL<g> is accessed repeatedly, charges stored in the cell capacitors CC1 and CC3 of the memory cells 51 and 53 connected to the word-lines WL<g−1> and WL<g+1> may leak gradually. In this case, the reliability of a logic '0' stored in the cell capacitor CC1 and a logic '1' stored in the cell capacitor CC3 may not be guaranteed. Therefore, the scrubbing operation on the memory cells is needed at an appropriate time.

Figure 11:
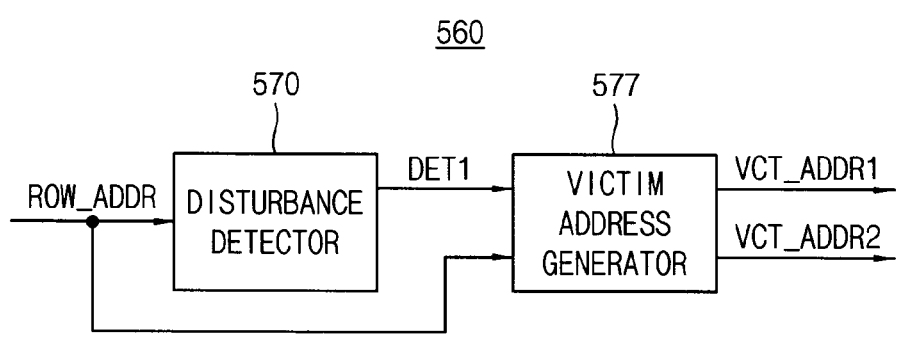
FIG. 11 is a block diagram illustrating an example of the victim address detector in the semiconductor memory device of FIG. 9 according to example embodiments.

FIG. 11 is a block diagram illustrating an example of the victim address detector in the semiconductor memory device of FIG. 9 according to example embodiments.

Referring to FIG. 11, the victim address detector 560 may include a disturbance detector 570 and a victim address generator 577.

The disturbance detector 570 may count a number of accesses to a first memory region (i.e., at least one memory cell row) based on the row address ROW_ADDR and may generate a first detection signal DET1 when the number of the counted accesses reaches a reference value during a reference (or predetermined) interval.

The victim address generator 577 may generate the at least one victim address VCT_ADDR1 and VCT_ADDR2 in response to the first detection signal DET1. The at least one victim address VCT_ADDR1 and VCT_ADDR2 may be a row address designating a second memory region and a third memory region which are located adjacent to the first memory region. The victim address generator 577 may provide the at least one victim address VCT_ADDR1 and VCT_ADDR2 to an address storing table in the scrubbing control circuit 500a.

Figure 12:
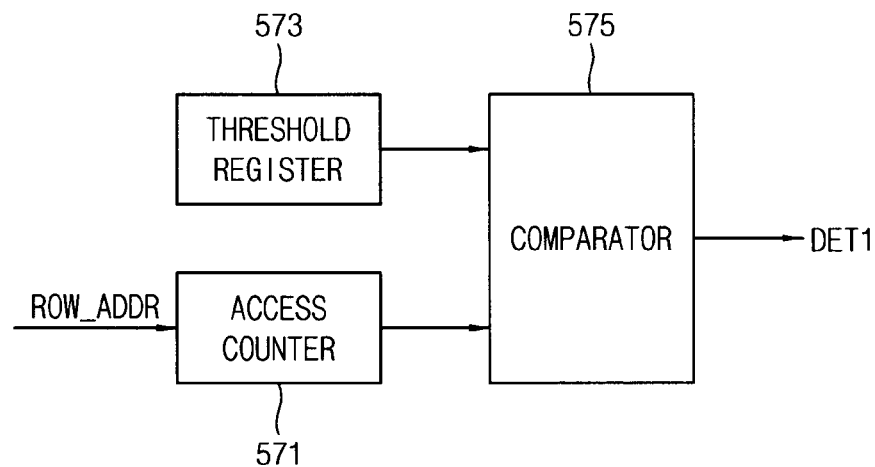
FIG. 12 is a block diagram illustrating the disturbance detector in the victim address detector of FIG. 11.

FIG. 12 is a block diagram illustrating the disturbance detector in the victim address detector of FIG. 11.

Referring to FIG. 12, the disturbance detector 570 may include access counter 571, a threshold register 573 and a comparator 575.

The access counter 571 may count a number of accesses to a specified address (or a specified memory region) based on the row address ROW_ADDR. For example, the access counter 571 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 573 may store a maximum disturbance occurrence count that guarantees the reliability of data in a specific word-line or a memory unit. For example, a threshold (or a reference value) on one word-line may be stored in the threshold register 573. Alternatively, a threshold on one word line group, one block, one bank unit, or one chip unit may be stored in the threshold register 573.

The comparator 575 may compare the reference value stored in the threshold register 573 with the number of accesses to a specific memory region counted by the access counter 571. If there is a memory region where the counted number of accesses reaches the reference value, the comparator 575 generates the first detection signal DET1. The comparator 575 provides the first detection signal DET1 to the victim address generator 577.

Figure 13:
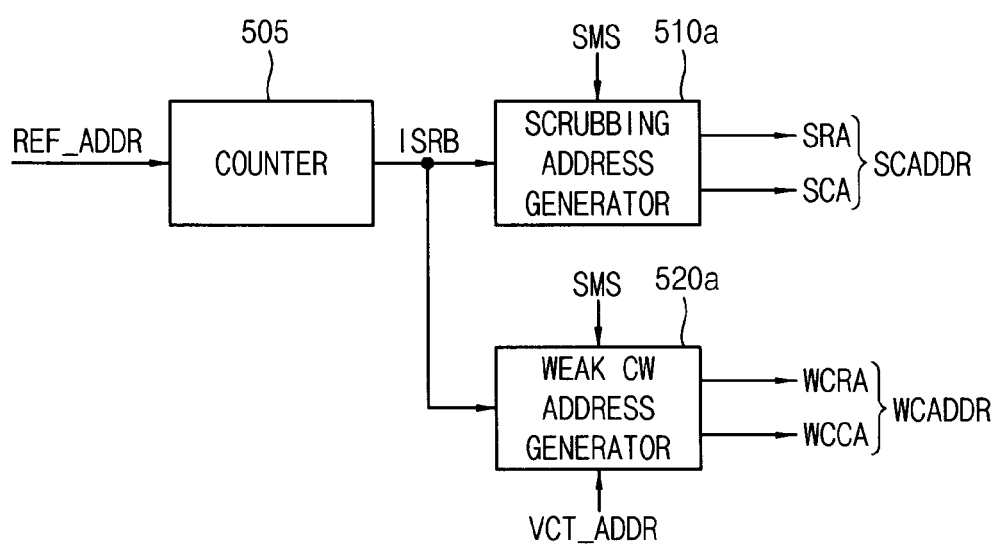
FIG. 13 is a block illustrating an example of the scrubbing control circuit in the semiconductor memory device of FIG. 9 according to example embodiments.

FIG. 13 is a block illustrating an example of the scrubbing control circuit in the semiconductor memory device of FIG. 9 according to example embodiments.

Referring to FIG. 13, the scrubbing control circuit 500a may include a counter 505, a scrubbing address generator 510a and a weak codeword address generator 520a.

Operations of the counter 505, a scrubbing address generator 510a are substantially similar with operations of the counter and the scrubbing address generator 510a in FIG. 4. The scrubbing address generator 510a further receives the scrubbing mode signal SMS and generates the normal scrubbing address SCADDR in the first scrubbing mode.

The weak codeword address generator 520a generates a weak codeword address WCADDR associated with a weak scrubbing operation associated with weak codewords in the bank array in the second scrubbing mode, in response to the internal scrubbing signal ISRB and the scrubbing mode signal SMS. The weak codeword address WCADDR includes a weak codeword row address WCRA and a weak codeword column address WCCA. The scrubbing mode signal SMS indicates the first scrubbing mode when the scrubbing mode signal SMS has a first logic level and indicates the second scrubbing mode when the scrubbing mode signal SMS has a second logic level. The scrubbing mode signal SMS may be included in the third control signal CTL3. The weak codeword address generator 520a provides the weak codeword row address WCRA to the corresponding row decoder and provides the weak codeword column address SCA to the corresponding column decoder.

The weak codeword address generator 520a may include an address storing table therein and the address storing table may store addresses of codewords associated with the victim address VCT_ADDR. The scrubbing operation performed based on the weak codeword address WCADDR may be referred to as a target scrubbing operation because the scrubbing operation is performed on the weak codewords.

Figure 14:
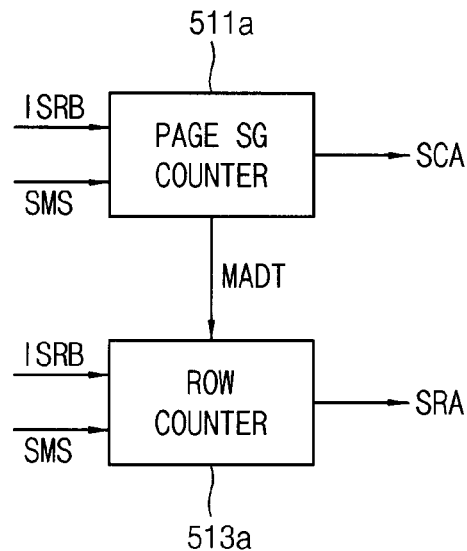
FIG. 14 is a block diagram illustrating the scrubbing address generator in the scrubbing control circuit of FIG. 13 according to example embodiments.

FIG. 14 is a block diagram illustrating the scrubbing address generator in the scrubbing control circuit of FIG. 13 according to example embodiments.

Referring to FIG. 14, the scrubbing address generator 510a may include a page segment counter 511a and a row counter 513a.

The page segment counter 511a increases the scrubbing column address SCA by one when the internal scrubbing signal ISRB is activated in the first scrubbing mode, and actives a maximum address detection signal MADT and is reset whenever the scrubbing column address SCA reaches its maximum value, in response to the internal scrubbing signal ISRB and the scrubbing mode signal SMS. The page segment counter 511a provides the maximum address detection signal MADT to the row counter 513a.

The row counter 513a starts counting operation one receiving the internal scrubbing signal ISRB initially and increases the scrubbing row address SRA by one whenever the activated maximum address detection signal MADT in response to the internal scrubbing signal ISRB and the scrubbing mode signal SMS.

Figure 15:
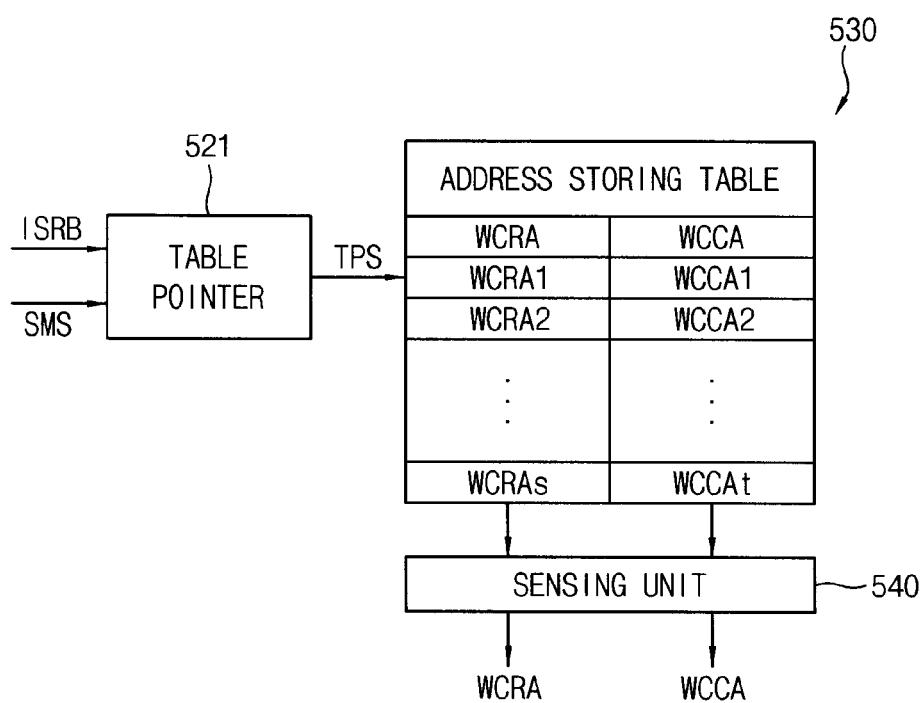
FIG. 15 illustrates the weak codeword address generator in the scrubbing control circuit of FIG. 13 according to example embodiments.

FIG. 15 illustrates the weak codeword address generator in the scrubbing control circuit of FIG. 13 according to example embodiments.

Referring to FIG. 15, the weak codeword address generator 520a may include a table pointer 521, an address storing table 530 and a sensing unit 540.

The address storing table 530 stores address information WCRA1~WCRAs and WCCA1~WCCAt (t is a positive integer greater than s) of weak codewords included in the memory cell array 300.

The weak codewords may be all or some of a weak page including a number of error bits greater than a reference value among pages in bank arrays of the memory cell array. In addition, the weak codewords may be codewords of neighbor pages adjacent to the intensively accessed memory region.

The table pointer 521 may generate a pointer signal TPS which provide location information for the address storing table 530 in response to the internal scrubbing signal ISRB and the scrubbing mode signal SMS during the first interval in the second scrubbing mode, and provides the pointer signal TPS to the address storing table 530. The address storing table 530 may include a nonvolatile storage. The at least one victim address VCT_ADDR1 and VCT_ADDR2 provided from the victim address generator 577 in FIG. 11 may be stored in the address storing table 530.

The pointer signal TPS gradually increases by a predetermined times during the first interval and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 provides the weak codeword row address WCRA to a corresponding row decoder and provides the weak codeword column address WCCA to a corresponding column decoder.

The control logic circuit 210a may apply different refresh periods to some memory cell rows based on a number of error bits for each of the memory cell rows, which are detected by the scrubbing operation.

Figure 16:
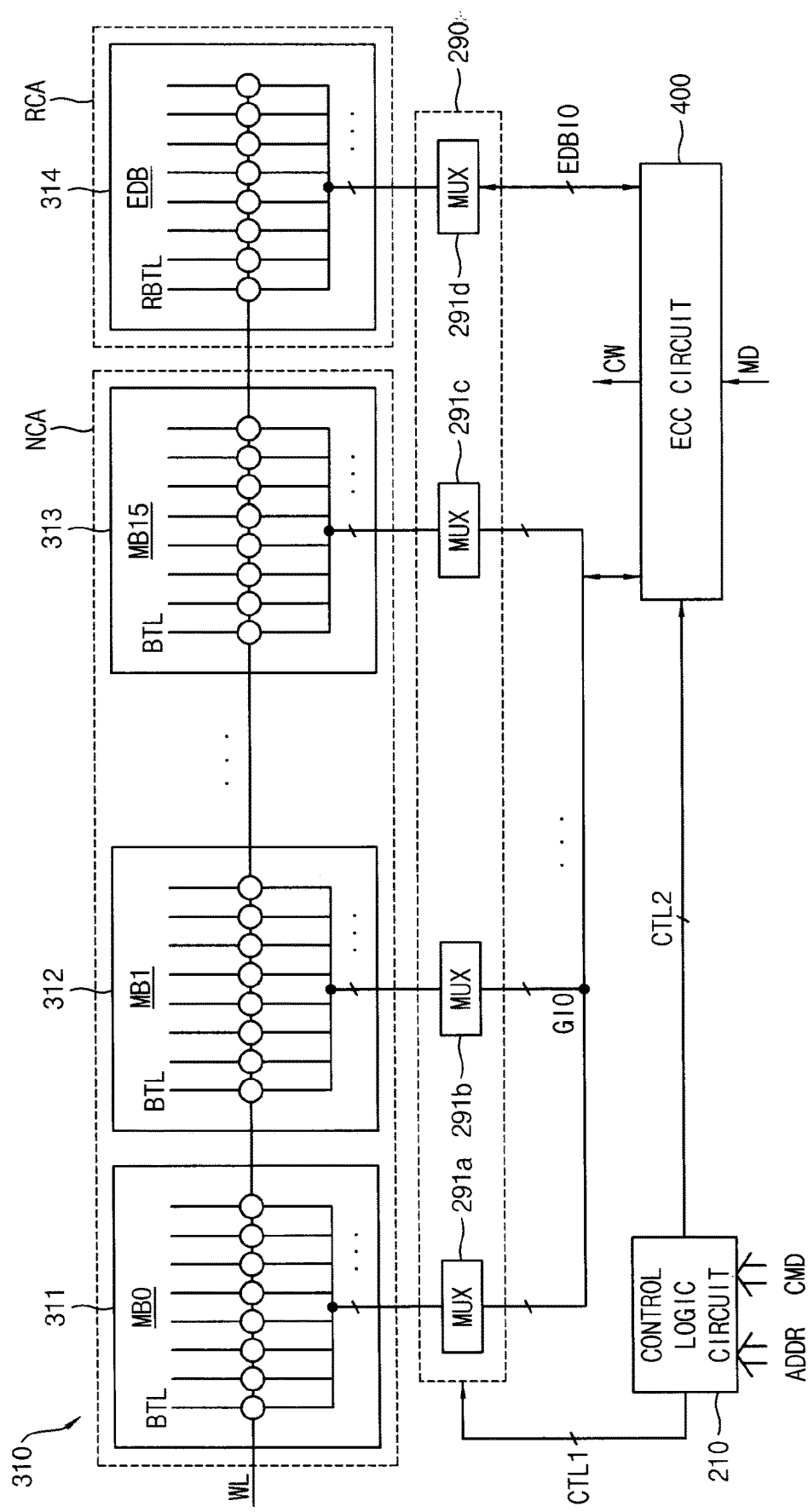
FIG. 16 illustrates a portion of the semiconductor memory device of FIG. 2 in a write operation.

FIG. 16 illustrates a portion of the semiconductor memory device of FIG. 2 in a write operation.

In FIG. 16, the control logic circuit 210, the first bank array 310, the I/O gating circuit 290, and the ECC circuit 400 are illustrated.

Referring to FIG. 16, the first bank array 310 includes a normal cell array NCA and a redundancy cell array RCA. The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200. The second memory block 314 is for ECC and/or redundancy repair. Because the second memory block 314 for ECC and/or redundancy repair is used for ECC, data line repair and block repair to repair 'fail' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 includes a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The ECC circuit 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the ECC circuit 400.

When the command CMD is a write command, the control logic circuit 210 provides the second control signal CTL2 to the ECC circuit 400, and the ECC circuit 400 performs the ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW is to be stored in a sub-page of the target page in the first bank array 310.

Figure 17:
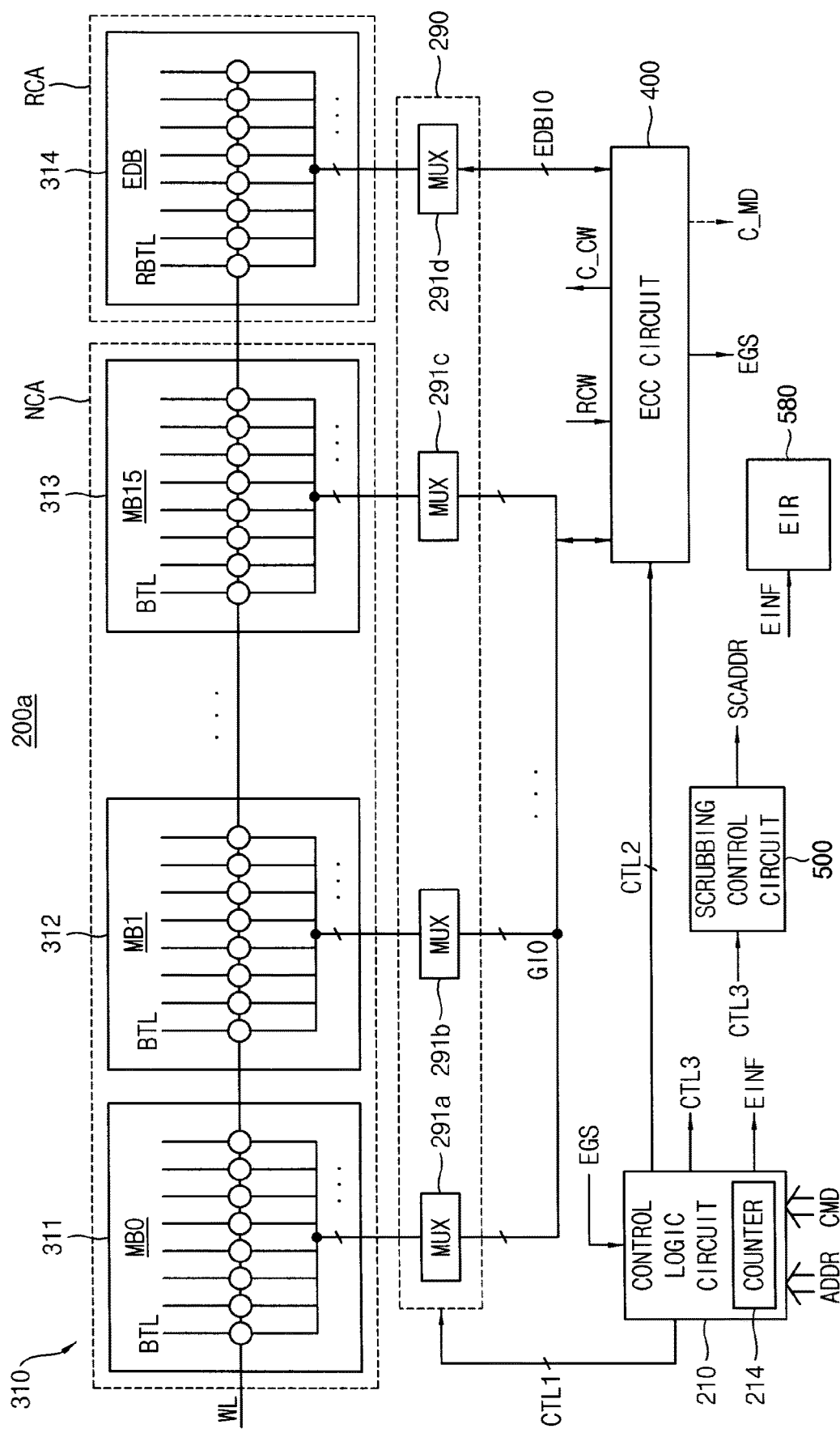
FIG. 17 illustrates a portion of the semiconductor memory device of FIG. 2 in a refresh operation or a read operation.

FIG. 17 illustrates a portion of the semiconductor memory device of FIG. 2 in a refresh operation or a read operation.

Referring to FIG. 17, when the command CMD is a refresh command (a first command) to designate a refresh operation, the control logic circuit 210 provides the first control signal CTL1 to the I/O gating circuit 290 such that a first (read) codeword RCW stored in each of sub-pages of the target page in the first bank array 310 is provided to the ECC circuit 400.

In the refresh operation, the ECC circuit 400 performs the ECC decoding on the codeword RCW and provides the error generation signal EGS to the control logic circuit 210 in response to detecting an error bit. The control logic circuit 210 may count the error generation signal EGS for one page and may record error information EINF of the one page in the error information register 580. The error information EINF may include address of a codeword including an error bit, a number of codewords including an error bit and address of the one page. In addition, the control logic circuit 210 may record a number of error bits in each codeword RCW in the error information register 580.

When the error detection on the codewords in one page is completed, the control logic circuit 210 may selectively determine whether to write back a codeword in which the error bit is detected, based on the error information EINF. For example, the control logic circuit 210 may control the ECC circuit 400 and the I/O gating circuit 290 based on the error information EINF such that the ECC circuit 400 corrects an error bit in the codeword RCW and writes back the corrected codeword in the memory location in response to the codeword RCW including an error bit which is to be corrected by the ECC circuit 400. The control logic circuit 210 may control the ECC circuit 400 such that writing back the corrected codeword in the memory location is performed after the error detection on the M codewords is completed.

For example, the control logic circuit 210 may control the ECC circuit 400 based on the error information EINF such that the ECC circuit 400 writes back correctable codewords in corresponding memory locations, respectively, in response to a number of the correctable codewords of the M codewords being smaller than K. K is a natural number greater than two, and each of the correctable codewords includes an error bit to be corrected by the ECC circuit 400.

For example, the control logic circuit 210 may control the ECC circuit 400 and the I/O gating circuit 290 based on the error information EINF such that the ECC circuit 400 skips writing back the corrected codeword in the memory location in response to the codeword RCW including error bits which are not to be corrected by the ECC circuit 400. In addition, the control logic circuit 210 may control the ECC circuit 400 based on the error information EINF such that the ECC circuit 400 skips writing back of correctable codewords in corresponding memory locations, in response to a number of the correctable codewords of the M codewords being equal to or greater than K.

When the command CMD corresponds to a read command, the ECC circuit 400 may provide a corrected main data C_MD to the data I/O buffer 295. In this case, the ECC circuit 400 may perform a selective scrubbing operation to write back a codeword including a correctable error bit in a corresponding memory location.

Therefore, the ECC circuit 400, in a scrubbing operation performed in response to a refresh command or a read command, performs an error detection (operation) on codewords in a selected memory cell row and writes back codewords, each including a correctable error bit, in corresponding memory locations, in response to error information. Accordingly, the ECC circuit 400 may reduce time interval for performing the scrubbing operation and may reduce scrubbing period.

FIG. 18 illustrates the error information register in the semiconductor memory device of FIG. 2 according to example embodiments.

Referring to FIG. 18, the error information register 580 includes a first register 581 and a second register 586.

Each of indexes (e.g., entries) Idx11, Idx12, . . . , Idx1u (u is a natural number greater than two) of the first register 581 may include page error information on a first group of pages of memory cell array 300. Each entry may correspond to one of the pages. The first register 581 includes a plurality of columns 582, 583, 584 and 585.

The column 582 stores address information ADDINF of each of the first group of pages. In an example embodiment, the address information ADDINF includes at least one of a bank group address ('BGA'), a bank address ('BA'), and a row address ('RA').

The column 583 stores a number of error occurrences ECNT of each of the first group of pages. For example, the first register 580 of FIG. 18 illustrates the number of error occurrences ECNT for a page having address A is 2 and the number of error occurrences ECNT for a page having address B is 4.

The column 584 stores a number of sub-pages FCWCNT including a bit error, of each of the first group of pages. The column 585 stores row fault flag RWF each of the first group of pages. The row fault flag RWF may indicate whether each of the first group of pages includes K or more codewords having an error bit. If the page includes K or more codewords with an error bit, the row fault flag RWF has a second logic level (e.g., 1).

Each of indexes (e.g., entries) Idx21, Idx22, . . . , Idx2v (v is a natural number greater than two) of the second register 586 may include error information on the codewords including an error bit. The second register 586 includes a plurality of columns 587, 588 and 589.

The column 587 stores address information ADDINF of each of the some pages. The column 588 stores codeword address information FCWADD of each of faulty codewords including an error bit. The column 589 stores a flag FG of each of faulty codewords and the flag FG indicates whether each of the faulty codewords include an error bit to be corrected by the ECC circuit 400. If the faulty codeword includes error bits that are not correctable by the ECC circuit 400, the flag FL has a second logic level (e.g., 1).

Figure 19:
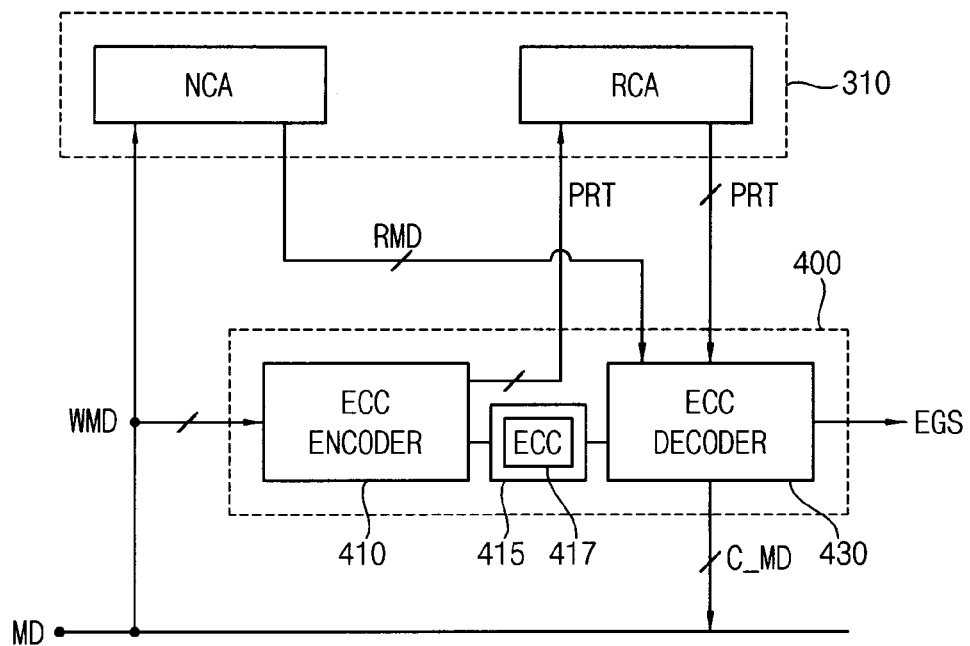
FIG. 19 is a block diagram illustrating an example of the ECC circuit in the semiconductor memory device of FIG. 2 according to example embodiments.

FIG. 19 is a block diagram illustrating an example of the ECC circuit in the semiconductor memory device of FIG. 2 according to example embodiments.

Referring to FIG. 19, the ECC circuit 400 includes an ECC encoder 410, an ECC decoder 430 and a (ECC) memory 415. The memory 415 may store an ECC 417. The ECC 417 may be a single error correction (SEC) code or a single error correction/double error detection (SECDED) code.

The ECC encoder 410 may generate parity data PRT using the ECC 417, associated with a write data WMD to be stored in the normal cell array NCA of the first bank array 310. The parity data PRT may be stored in the redundancy cell array RCA of the first bank array 310.

The ECC decoder 430 may perform an ECC decoding on a read data RMD based on the read data RMD and the parity data PRT read from the first bank array 310 using the ECC 417. When the read data RMD includes at least one error bit as a result of the ECC decoding, the ECC decoder 430 provides the error generation signal EGS to the control logic circuit 210, selectively corrects the error bit in the read data RMD in a scrubbing operation and outputs the corrected main data C_MD in a read operation.

Figure 20:
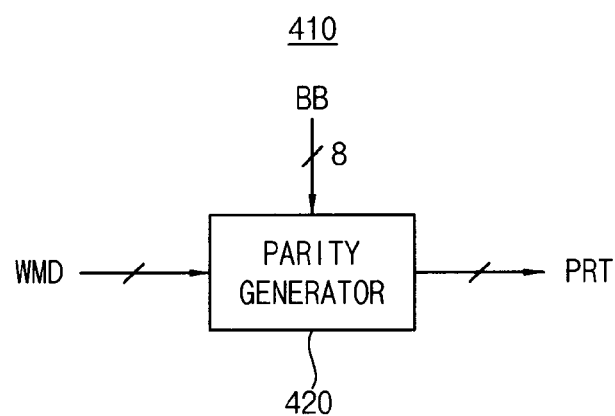
FIG. 20 illustrates an example of the ECC encoder in the ECC circuit of FIG. 19 according to example embodiments.

FIG. 20 illustrates an example of the ECC encoder in the ECC circuit of FIG. 19 according to example embodiments.

Referring to FIG. 20, the ECC encoder 410 may include a parity generator 420. The parity generator 420 receives write data WMD and basis bit BB and generates the parity data PRT by performing, for example, an XOR array operation.

Figure 21:
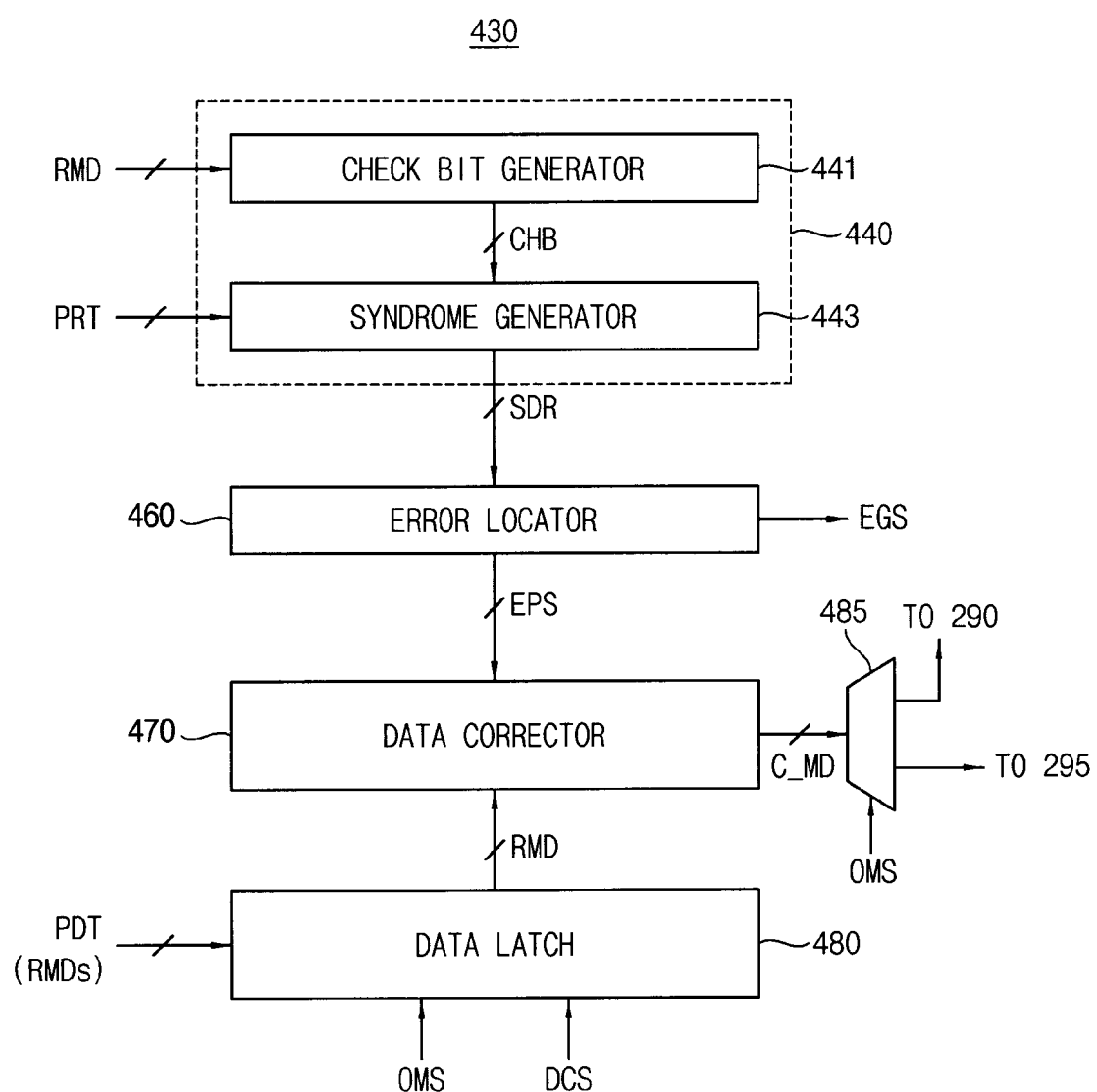
FIG. 21 illustrates an example of the ECC decoder in the ECC circuit of FIG. 19 according to example embodiments.

FIG. 21 illustrates an example of the ECC decoder in the ECC circuit of FIG. 19 according to example embodiments.

Referring to FIG. 21, the ECC decoder 430 may include a syndrome generation circuit 440, an error locator 460, a data corrector 470 a data latch 480 and a demultiplexer 485. The syndrome generation circuit 440 may include a check bit generator 441 and a syndrome generator 443.

The check bit generator 441 generates check bits CHB based on the read data RMD by performing an XOR array operation and the syndrome generator 443 generates a syndrome SDR by comparing corresponding bits of the parity data PRT and the check bits CHB.

The error locator 460 generates an error positon signal EPS indication a position of an error bit in the read data RMD to provide the error positon signal EPS to the data corrector 470 when all bits of the syndrome SDR are not 'zero'. In addition, when the read data RMD includes the error bit, the error locator 460 provides the error generation signal EGS to the control logic circuit 210.

The data latch 480, in a scrubbing operation, receives page data PDT including a plurality of read data RMDs, provides the data corrector 470 with the read data RMD including correctable error bit in a scrubbing operation or provides the data corrector 470 with the read data RMD without regard to error bit, in a read operation, in response to an operation mode signal OMS and a data control signal DCS. The operation mode signal OMS may designate one of the scrubbing operation and the read operation. The operation mode signal OMS and the control signal DCS may be included in the second control signal CTL2 in FIG. 2.

The data corrector 470 receives the read data RMD, corrects the error bit in the read data RMD based on the error position signal EPS when the read data RMD includes the error bit and outputs the corrected main data C_MD. The demultiplexer 485, in response to the operation mode signal OMS, provides the corrected main data C_MD to the I/O gating circuit 290 in the scrubbing mode and provides the corrected main data C_MD to the data I/O buffer 295 in the read operation.

Figure 22:
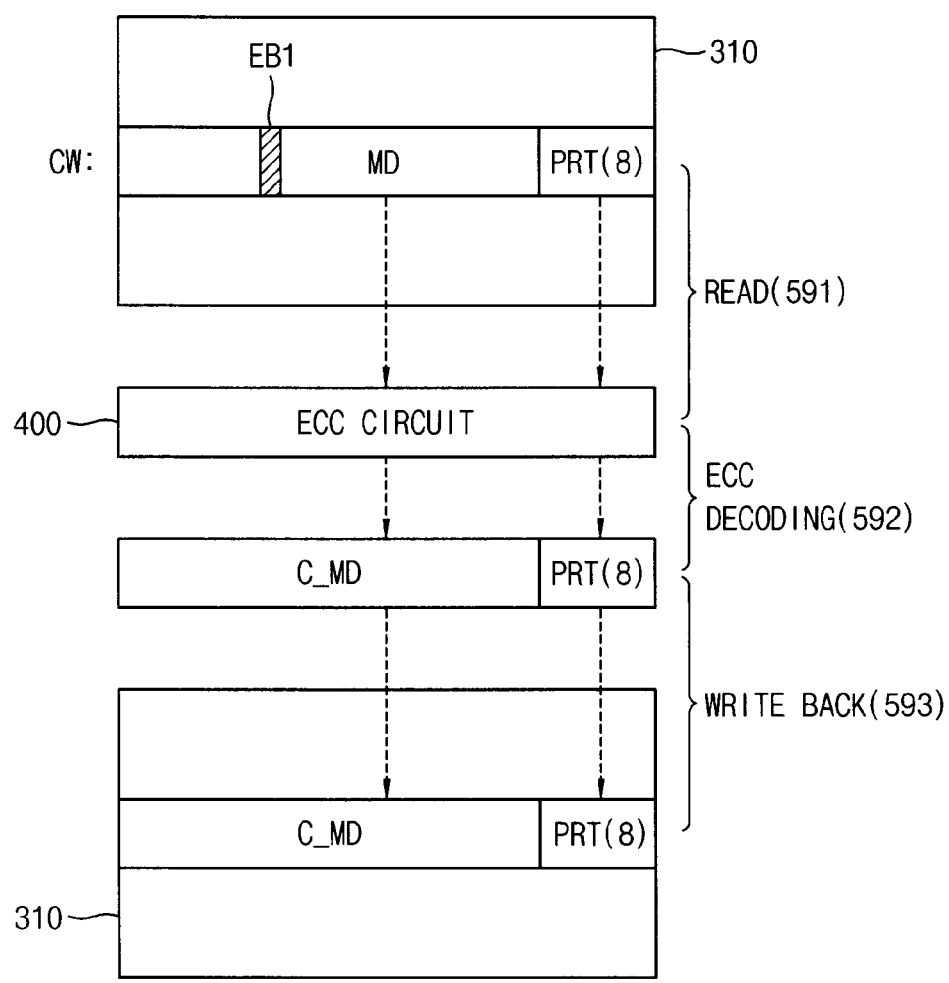
FIG. 22 illustrates an operation of the ECC decoder of FIG. 21 according to example embodiments

FIG. 22 illustrates an operation of the ECC decoder of FIG. 21 according to example embodiments.

Referring to FIGS. 21 and 22, in a scrubbing operation in response to a refresh command, the codeword CW includes an error bit EB1. The codeword CW is read from a first page and is provided to the ECC circuit 400 as a reference numeral 591 indicates. The ECC circuit 400 performs the ECC decoding on the codeword CW to correct the at least one error bit EB1 as a reference numeral 592 indicates and writes back the corrected main data C_MD in a sub-page of the first page as a reference numeral 593 indicates.

Figure 23:
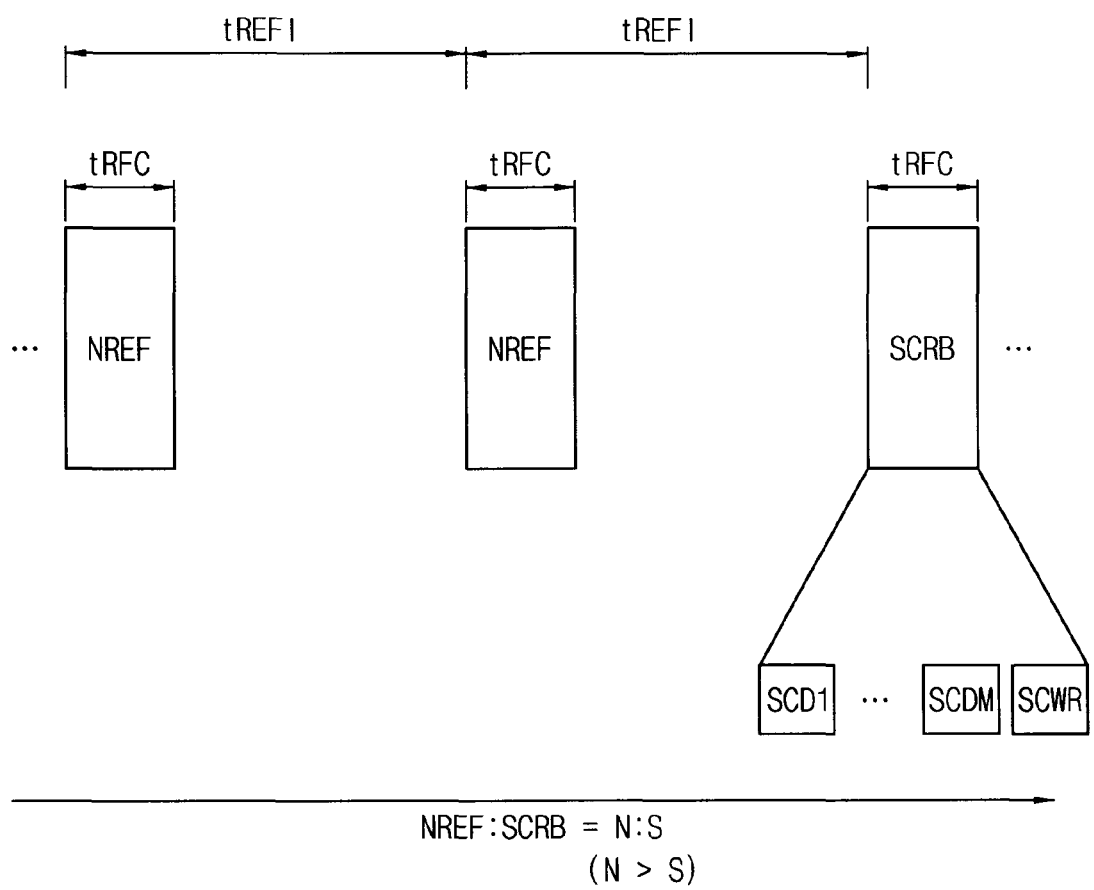
FIG. 23 illustrates a normal refresh operation and a scrubbing operation performed in the semiconductor memory device of FIG. 2.

FIG. 23 illustrates a normal refresh operation and a scrubbing operation performed in the semiconductor memory device of FIG. 2.

In FIG. 23, tRFC denotes a refresh cycle and indicates a time for refreshing one row, and tREFI denotes a refresh interval and indicates an interval between two consecutive refresh commands.

Referring to FIG. 23, it is noted that the scrubbing control circuit 500 designates memory cell rows S times, on which the ECC circuit performs the scrubbing operation SCRB whenever the normal refresh operation REF is performed on memory cell rows N-times in response to the refresh command. S is a natural number smaller than N. The scrubbing operation SCRB on one memory cell row includes M scrubbing error detection operations SCD1~SCDM and at least one write-back operation SCWR. The ECC circuit 400 in the semiconductor memory device 200 sequentially reads data corresponding to a codeword from each of M sub-pages in the memory cell row, performs error detection on M codewords and writes back codewords, each including a correctable error bit, in a corresponding memory location. Therefore, the ECC circuit 400 may reduce a scrubbing period.

Figure 24:
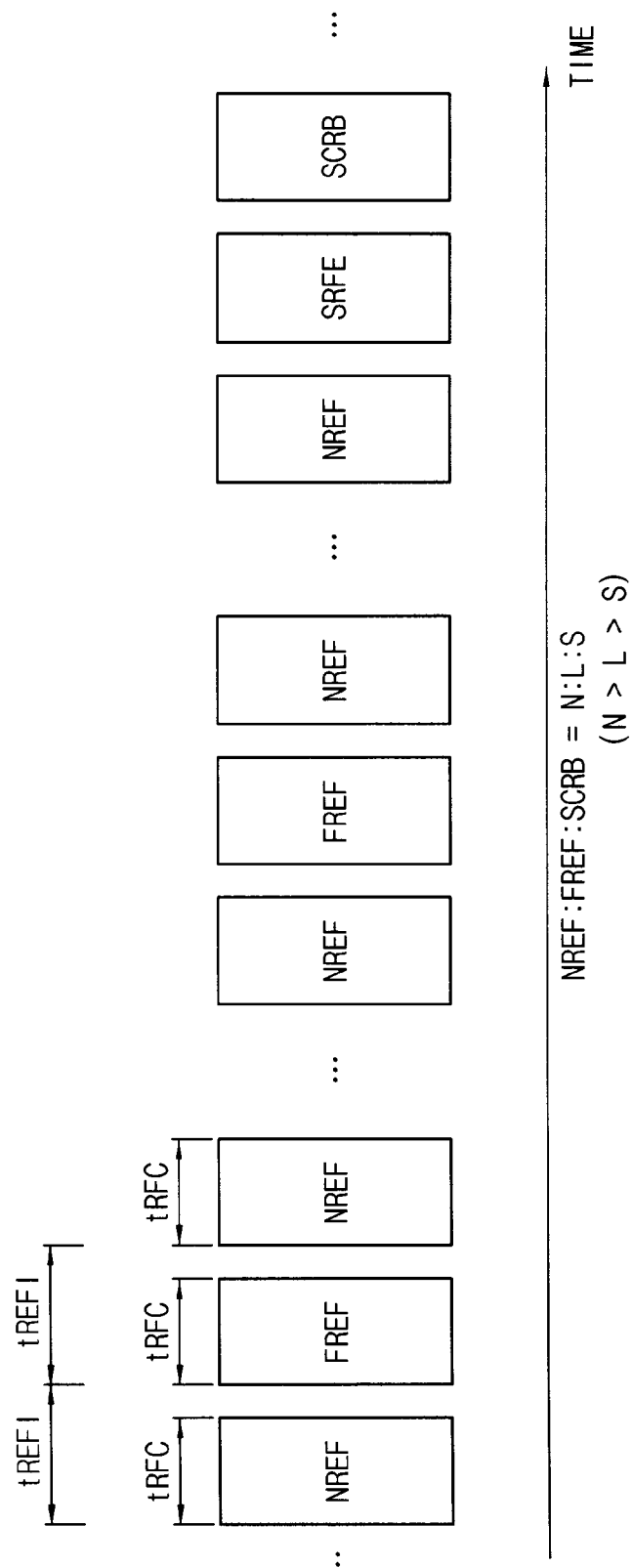
FIG. 24 illustrates a refresh operation and a scrubbing operation performed in the semiconductor memory device of FIG. 2.

FIG. 24 illustrates a refresh operation and a scrubbing operation performed in the semiconductor memory device of FIG. 2.

Referring to FIG. 24, it is noted that the scrubbing control circuit 500 designates memory cell rows S times, on which the ECC circuit 400 performs the scrubbing operation SCRB and a refresh operation FREF on an adjacent memory region corresponding to the victim address VCT_ADDR is performed L times whenever the normal refresh operation NREF is performed on memory cell rows N-times in response to the refresh command. Here L is a natural number smaller than N and S is a natural number smaller than L.

Figure 25:
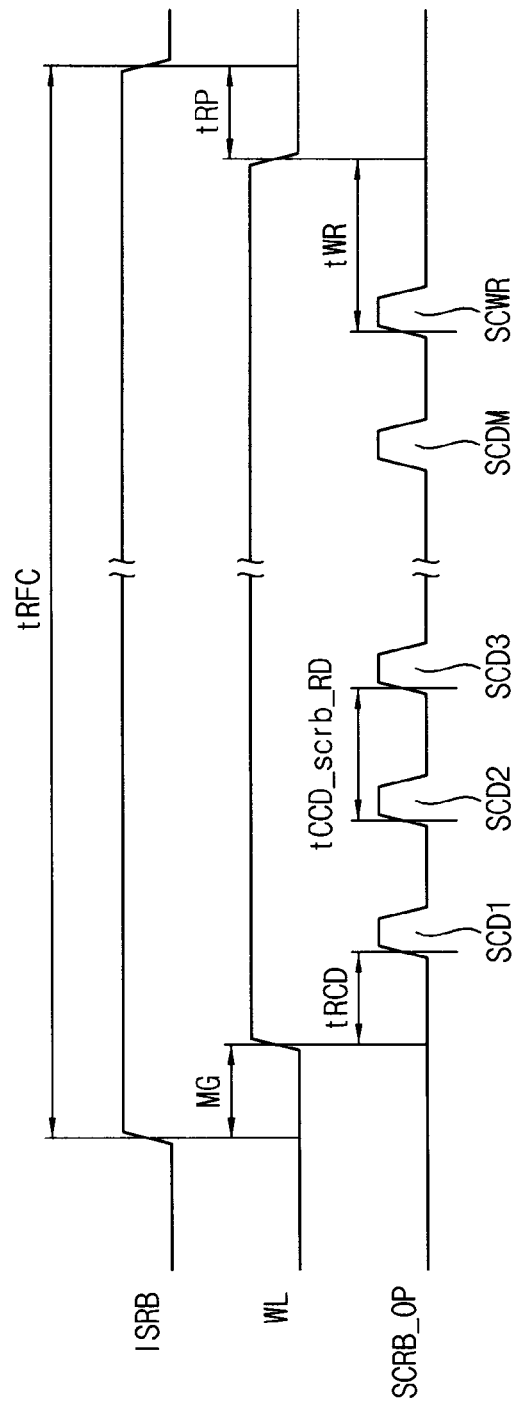
FIG. 25 illustrates a timing of the scrubbing operation in FIG. 23 or in FIG. 24.

FIG. 25 illustrates a timing of the scrubbing operation in FIG. 23 or in FIG. 24.

Referring to FIG. 25 during the refresh cycle tRFC while a refresh operation is being performed on one memory cell row, the internal scrubbing signal ISRB is activated with a logic high level. A word-line WL coupled to a memory cell row designated by the scrubbing row address is activated after the refresh command is applied and a margin MG elapses. Scrubbing error detection operations SCD1~SCDM are sequentially performed on M codewords in the memory cell row designated by the scrubbing row address after the word-line WL is activated and RAS to CAS delay time tRCD elapses. The scrubbing error detection operation on one codeword is performed during a time interval tCCD-_scrb_RD. Some codewords, each including an error bit to be corrected by the ECC circuit 400, among the codeword in which at least one error bit is detected are corrected, and during write time tWR, corrected codewords are written back in corresponding memory locations and the word-line WL is deactivated after the corrected codewords are written back SCWR. The internal scrubbing signal ISRB is deactivated after the word-line is deactivated and a row precharge time tRP elapses. Scrubbing operation SCRB_OP includes scrubbing error detection operations, error correction and writing back of some codewords.

Accordingly, the ECC circuit 400 sequentially performs the error detection operations on M codewords in a memory cell row and writes back some codewords based on the error information EINF while the refresh operation is performed on another memory cell row.

Figure 26:
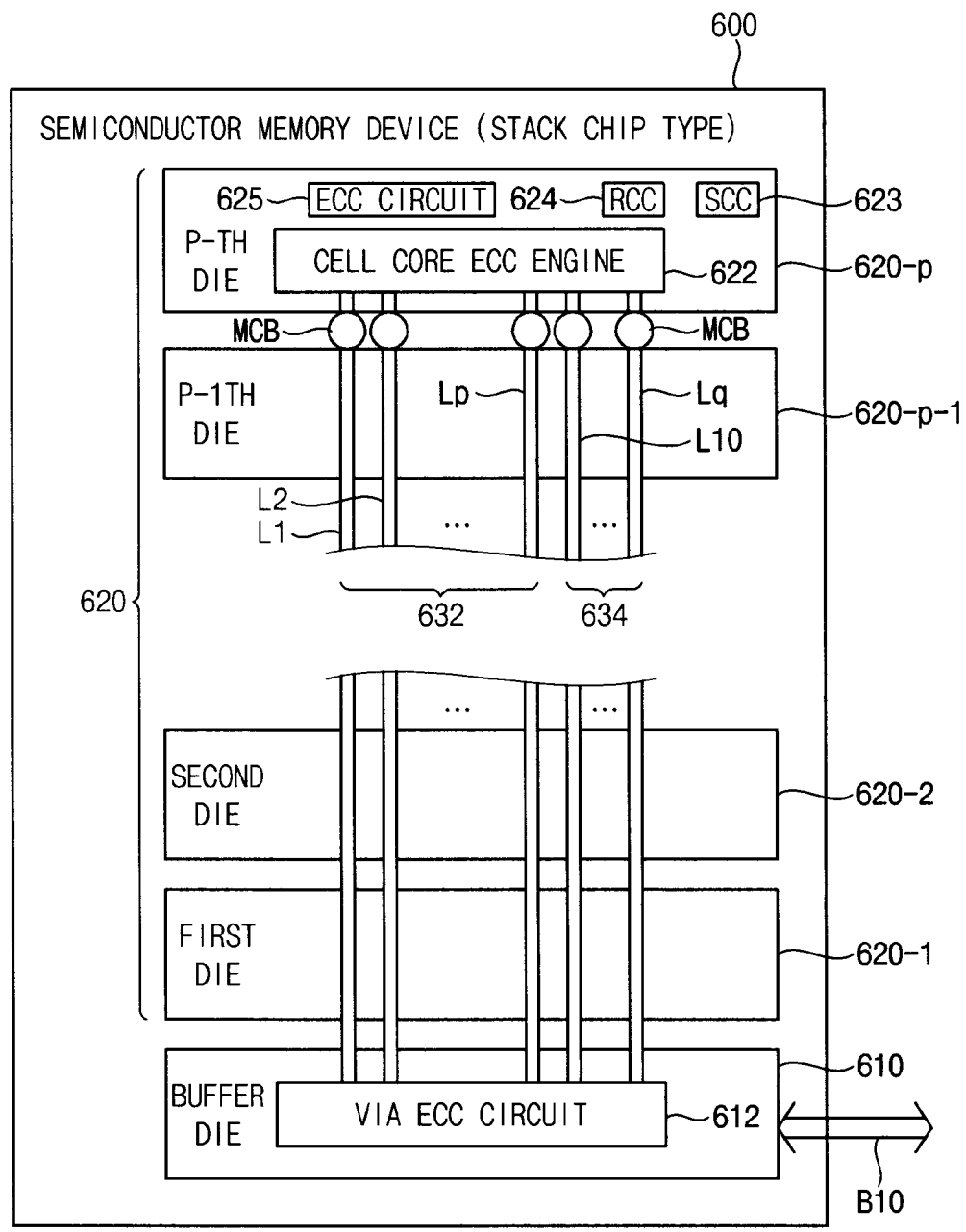
FIG. 26 is a block diagram illustrating a semiconductor memory device according to example embodiments.

FIG. 26 is a block diagram illustrating a semiconductor memory device according to example embodiments.

Referring to FIG. 26, a semiconductor memory device 600 may include a buffer die 610 and group dies 620 providing a soft error analyzing and correcting function in a stacked chip structure.

The group dies 620 may include a plurality of memory dies 620-1 to 620-p which is stacked on the buffer die 610 and conveys data through a plurality of through silicon via (TSV) lines.

At least one of the memory dies 620-1 to 620-p may include a cell core 622 including a memory cell array, an ECC circuit 625 which generates transmission parity bits (i.e., transmission parity data) based on transmission data to be sent to the buffer die 611, a refresh control circuit 624 and a scrubbing control circuit 623. The ECC circuit 622 may be referred to as 'cell core ECC circuit'. The ECC circuit 622 may employ the ECC circuit 400 of FIG. 19. The refresh control circuit 624 may employ the refresh control circuit 385 of FIG. 4. The scrubbing control circuit 623 may employ the scrubbing control circuit 500 of FIG. 7 or the scrubbing control circuit 500a. The ECC circuit 622 and the scrubbing control circuit 623 may perform scrubbing operation on codewords to correct error bit and may reduce scrubbing period by selectively determining whether to write back each of codewords in a memory cell row based on error information.

The buffer die 610 may include a via ECC circuit 612 which corrects a transmission error using the transmission parity bits when a transmission error is detected from the transmission data received through the TSV lines and generates error-corrected data.

The semiconductor memory device 600 may be a stack chip type memory device or a stacked memory device which conveys data and control signals through the TSV lines. The TSV lines may be also called 'through electrodes'.

A data TSV line group 632 which is formed at one memory die 620-p may include TSV lines L1 to Lp, and a parity TSV line group 634 may include TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the memory controller through the data bus B10.

The via ECC circuit 612 may determine whether a transmission error occurs at the transmission data received through the data TSV line group 632, based on the transmission parity bits received through the parity TSV line group 634. When a transmission error is detected, the via ECC circuit 612 may correct the transmission error on the transmission data using the transmission parity bits. When the transmission error is uncorrectable, the via ECC circuit 612 may output information indicating occurrence of an uncorrectable data error.

Figure 27:
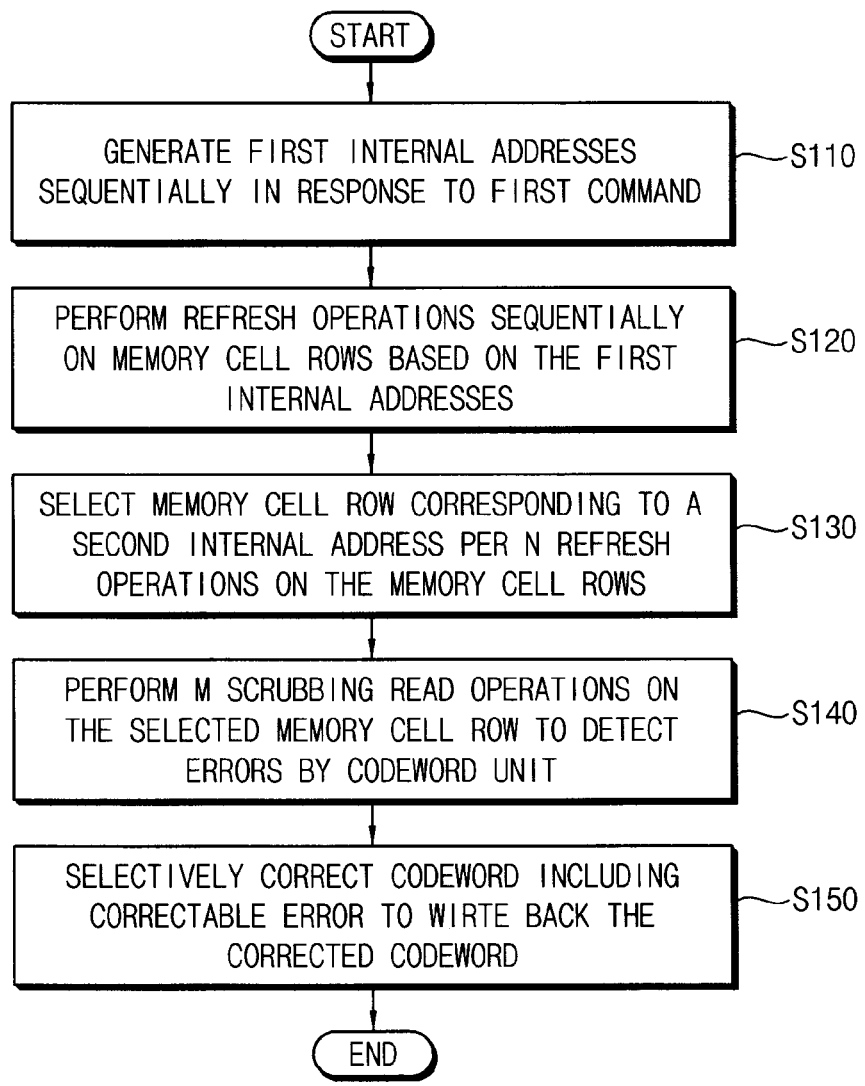
FIG. 27 is a flow chart illustrating a method of a semiconductor memory device according to example embodiments

FIG. 27 is a flow chart illustrating a method of a semiconductor memory device according to example embodiments.

Referring to FIGS. 2 through 27, in a method of operating a semiconductor memory device including a memory cell array 300 which includes a plurality of memory cell rows and each of the plurality of memory cell rows includes a plurality of volatile memory cells, first addresses are sequentially generated in response to a first command received from an external memory controller 100 (S110). The first command may be a refresh command and the first addresses may be refresh row address REF_ADDR generated by the refresh control circuit 385.

The memory cell rows are sequentially refreshed based on the first addresses (S120). A memory cell row is selected from the memory cell rows based on a second internal address which is generated in the semiconductor memory device 200, whenever the refresh operations are performed N times on the memory cell rows (S130). The ECC circuit 400 performs M ECC decoding operation on codewords in the selected memory cell row to detect an error bit by codeword unit (S140) and records error information in the error information register 580 in response to detecting an error bit. The second internal address may be a scrubbing address generated by the scrubbing control circuit.

The control logic circuit 210 controls the ECC circuit 400 based on the error information stored in the error information such that the ECC circuit 400 writes back a codeword including a correctable error bit in a corresponding memory location (S150).

Figure 28:
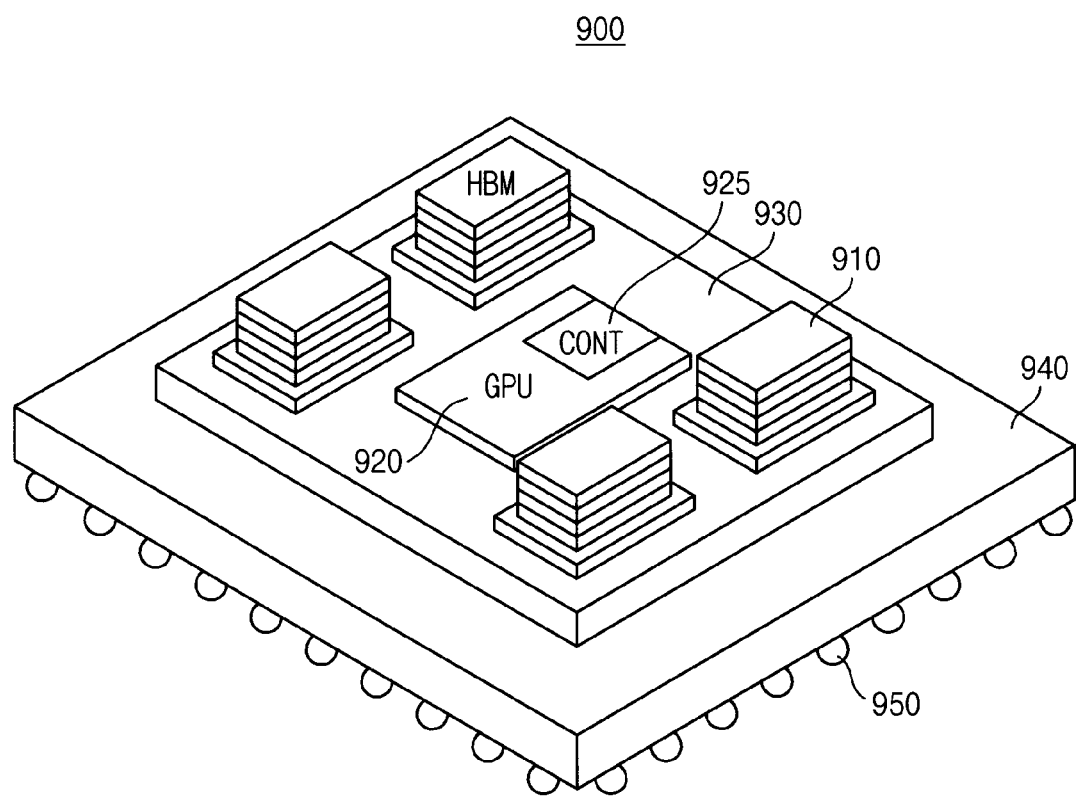
FIG. 28 is a diagram illustrating a semiconductor package including the stacked memory device, according to example embodiments.

FIG. 28 is a diagram illustrating a semiconductor package including the stacked memory device, according to example embodiments.

Referring to FIG. 28, a semiconductor package 900 may include one or more stacked memory devices 910 and a graphic processing unit (GPU) 920. The GPU 920 may include a memory controller 925.

The stacked memory devices 910 and the GPU 920 may be mounted on an interposer 930, and the interposer on which the stacked memory devices 910 and the GPU 920 are mounted may be mounted on a package substrate 940. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the memory dies may include a memory cell array, an ECC circuit and a scrubbing control circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, a semiconductor memory device includes an ECC circuit and a scrubbing control circuit. The ECC circuit sequentially performs error detection operation on codewords in a memory cell row designated by a scrubbing address provided from the scrubbing control circuit, a control logic circuit records error information associated with error detection in an error information register and the ECC circuit selectively writes back a codeword including a correctable error in a corresponding memory location based on the error information. Therefore, the semiconductor memory device may reduce scrubbing period while preventing error bits from being accumulated and may enhance credibility and performance.

At least one of the components, elements, modules, circuits, controllers, devices, generators, counters, oscillators, registers, comparators, or units represented by a block as illustrated in FIGS. 1, 2, 4-17, 19-21 and 26 may be embodied as various numbers of hardware, software and/or firmware structures that execute respective functions described above, according to an exemplary embodiment. For example, at least one of these components, elements, modules, circuits, controllers, devices, generators, counters, oscillators, registers, comparators, or units may use a direct circuit structure, such as a memory, a processor, a logic circuit, a look-up table, etc. that may execute the respective functions through controls of one or more microprocessors or other control apparatuses. Also, at least one of these components, elements, modules, circuits, controllers, devices, generators, counters, oscillators, registers, comparators, or units may be specifically embodied by a module, a program, or a part of code, which contains one or more executable instructions for performing specified logic functions, and executed by one or more microprocessors or other control apparatuses. Also, at least one of these components, elements, modules, circuits, controllers, devices, generators, counters, oscillators, registers, comparators, or units may further include or may be implemented by a processor such as a central processing unit (CPU) that performs the respective functions, a microprocessor, or the like. Two or more of these components, elements, modules, circuits, controllers, devices, generators, counters, oscillators, registers, comparators, or units may be combined into one single components, elements, modules, circuits, controllers, devices, generators, counters, oscillators, registers, comparators, or units which performs all operations or functions of the combined two or more components, elements, modules, circuits, controllers, devices, generators, counters, oscillators, registers, comparators, or units. Also, at least part of functions of at least one of these components, elements, modules, circuits, controllers, devices, generators, counters, oscillators, registers, comparators, or units may be performed by another of these components, elements, modules, circuits, controllers, devices, generators, counters, oscillators, registers, comparators, or units. Further, although a bus is not illustrated in the above block diagrams, communication between the components, elements, modules, circuits, controllers, devices, generators, counters, oscillators, registers, comparators, or units may be performed through the bus. Functional aspects of the above exemplary embodiments may be implemented in algorithms that execute on one or more processors. Furthermore, the components, elements, modules, circuits, controllers, devices, generators, counters, oscillators, registers, comparators, or units represented by a block or processing steps may employ any number of related art techniques for electronics configuration, signal processing and/or control, data processing and the like.

Aspects of the present disclosure may be applied to systems using semiconductor memory devices that employ an ECC circuit. For example, aspects of the present disclosure may be applied to systems such as a smart phone, a navigation system, a notebook computer, a desktop computer and a game console that use the semiconductor memory device as a working memory.

While example embodiments have been shown and described above, it will be apparent to those skilled in the art that many variations and modifications can be made to the described example embodiments without substantially departing from the principles of the present disclosure as defined by the appended claims.

What is claimed is:

1. A semiconductor memory device comprising:
a memory cell array including a plurality of memory cell rows, each of which includes volatile memory cells;
an error correction code (ECC) circuit;
an error information register;
a scrubbing control circuit configured to count refresh row addresses and output a scrubbing address to control a scrubbing operation to be performed on at least one sub-page in a first memory cell row of the plurality of memory cell rows each time the scrubbing control circuit counts N refresh row addresses, N being an integer greater than two; and
a control logic circuit configured to:
control the ECC circuit to sequentially read data corresponding to a first codeword from M sub-pages in the first memory cell row, perform error detection on the first codeword, and provide error information based on the error detection, the error information indicating an error occurrence count in the first codeword, M being an integer greater than one; and
record the error information in the error information register and selectively determine, based on the error information, whether to write back a corrected first codeword in a memory location in which the data corresponding to the first codeword is stored.

2. The semiconductor memory device of claim 1, further comprising a refresh control circuit configured to generate the refresh row addresses in response to a first command received from an external device,
wherein the first command is a refresh command, and
wherein the scrubbing control circuit is configured to sequentially generate scrubbing addresses designating M codewords included in the first memory cell row while a refresh operation is being performed on one of the plurality of memory cell rows.

3. The semiconductor memory device of claim 1, wherein the control logic circuit is further configured to control the ECC circuit to write back the corrected first codeword in the memory location in response to the error information indicating that the first codeword includes an error bit which is to be corrected by the ECC circuit.

4. The semiconductor memory device of claim 3, wherein the control logic circuit is further configured to control the ECC circuit to write back the corrected first codeword in the memory location after the error detection on the M sub-pages in the first memory cell row is completed.

5. The semiconductor memory device of claim 1, wherein the control logic circuit is further configured to control the ECC circuit to skip writing back the corrected first codeword in the memory location in response to the error information indicating that the first codeword includes error bits which are not to be corrected by the ECC circuit.

6. The semiconductor memory device of claim 1, wherein the control logic circuit is further configured to control the ECC circuit to write back correctable codewords in corresponding memory locations, respectively, in response to the error information indicating a number of the correctable codewords of the M sub-pages in the first memory cell row being less than K, K being a natural number greater than two, each of the correctable codewords including an error bit to be corrected by the ECC circuit.

7. The semiconductor memory device of claim 1, wherein the control logic circuit is further configured to control the ECC circuit to skip writing back correctable codewords in corresponding memory locations, based on the error information indicating a number of the correctable codewords of the M sub-pages in the first memory cell row being equal to or greater than K, K being a natural number greater than two, each of the correctable codewords including an error bit to be corrected by the ECC circuit.

8. The semiconductor memory device of claim 1, wherein the scrubbing control circuit comprises:
a counter configured to count the refresh row addresses and activate an internal scrubbing signal each time the counter counts N refresh row addresses; and
a scrubbing address generator configured to generate a normal scrubbing address associated with a normal scrubbing operation for the first memory cell row based on the internal scrubbing signal.

9. The semiconductor memory device of claim 8, wherein the normal scrubbing address comprises a scrubbing row address designating one memory cell row and a scrubbing column address designating one of codewords included in the one memory cell row, and
wherein the scrubbing address generator comprises:
a page segment counter configured to increase the scrubbing column address by one based on the internal scrubbing signal being activated; and
a row counter configured to increase the scrubbing column address by one based on the scrubbing column address reaching a maximum value.

10. The semiconductor memory device of claim 1, wherein the scrubbing control circuit includes:
a counter configured to count a number of times a refresh operation is performed on of the plurality of memory cell rows, and activate an internal scrubbing signal each time the counter counts N refresh row addresses;
a scrubbing address generator configured to generate a normal scrubbing address associated with a normal scrubbing operation for the first memory cell row in a first scrubbing mode based on the internal scrubbing signal and a scrubbing mode signal; and
a weak codeword address generator configured to generate a weak codeword address indicating weak codewords in the first memory cell row in a second scrubbing mode based on the internal scrubbing signal and the scrubbing mode signal.

11. The semiconductor memory device of claim 10, wherein the weak codeword address generator comprises:
an address storing table configured to store address information of the weak codewords; and
a table pointer configured to generate a pointer signal that indicates location information of the address storing table based on the internal scrubbing signal.

12. The semiconductor memory device of claim 1, wherein the control logic circuit is configured to:
control, based on a second command from an external device, the ECC circuit to read data corresponding to a second codeword from at least one sub-page in a second memory cell row of the plurality of memory cell rows designated by an access address, and provide an error generation signal to the control logic circuit based on at least one error bit being detected in the second codeword;
record address information of the second codeword in the error information register; and
control the ECC circuit to write back a corrected second codeword in a memory location in which the data is stored based on the second codeword a correctable error bit, and
wherein the second command corresponds to a read command.

13. The semiconductor memory device of claim 1, wherein the ECC circuit comprises an ECC decoder configured to perform an error detection operation on M codewords included in the first memory cell row.

14. The semiconductor memory device of claim 13, wherein the ECC decoder comprises:
a data latch configured to store the M codewords;
a syndrome generation circuit configured to generate a syndrome based on main data and parity data of each of the M codewords;
an error locator configured to, based on the syndrome, generate an error position signal indicating a position of at least one error bit in the main data; and
a data corrector configured to receive K−1 codewords which are selected from the M codewords stored in the data latch based on the error information, and correct an error bit in each of the K−1 codewords, K being a natural number greater than two.

15. The semiconductor memory device of claim 1, further comprising:
a victim address detector configured to count a number of accesses to a first memory region in the memory cell array and generate at least one victim address designating at least one adjacent memory region that is adjacent to the first memory region based on the number of accesses reaching a threshold value during a reference interval, wherein the victim address detector is further configured to provide the at least one victim address to the scrubbing control circuit and, wherein the scrubbing control circuit is configured to store the at least one victim address in an address storing table as a weak codeword address.

16. The semiconductor memory device of claim 1, wherein the scrubbing operation comprises performing consecutive error detection operations on M codewords included in the first memory cell row and write-back operations on K−1 codewords which are selected from the M codewords based on a result of the error detection operations.

17. The semiconductor memory device of claim 1, further comprising:
at least one buffer die; and
a plurality of memory dies provided on the at least one buffer die and configured to convey data through a plurality of through silicon via (TSV) lines formed therethrough,
wherein at least one of the plurality of memory dies comprises the memory cell array, the ECC circuit, the scrubbing control circuit and a refresh control circuit configured to generate the refresh row addresses.

18. The semiconductor memory device of claim 17, wherein the ECC circuit is configured to generate transmission parity bits based on transmission data to be sent to the at least one buffer die, and
wherein the at least one buffer die comprises a via ECC circuit configured to correct a transmission error using the transmission parity bits based on a transmission error being detected from the transmission data received through the plurality of TSV lines.

19. A method of operating a semiconductor memory device including a memory cell array that includes a plurality of memory cell rows, each of which includes a plurality of volatile memory cells, the method comprising:
generating first addresses sequentially based on a first command received from an external device;
sequentially performing a refresh operation on the plurality of memory cell rows based on the first addresses;
selecting a first memory cell row corresponding to a second address, of the plurality of memory cell rows each time the refresh operation is performed N times, N being an integer greater than two, the second address being generated in the semiconductor memory device;
performing, in an error correction code (ECC) circuit of the semiconductor memory device, an ECC decoding on codewords in the first memory cell row M times to detect an error bit, M being an integer greater than one;
generating, in the ECC circuit, a corrected codeword based on a codeword including a correctable error bit; and
writing back the corrected codeword in a memory location corresponding to the codeword including the correctable error bit.

20. A semiconductor memory device comprising:
a memory cell array including a plurality of memory cell rows, each of which includes volatile memory cells;
an error correction code (ECC) circuit;
an error information register;
a refresh control circuit configured to generate refresh row addresses indicating memory cell rows based on a first command received from an external device;
a scrubbing control circuit configured to count the refresh row addresses and output a scrubbing address to control a scrubbing operation to be performed on at least one sub-page in a first memory cell row of the plurality of memory cell rows each time the scrubbing control circuit counts N refresh row addresses, N being an integer greater than two; and
a control logic circuit configured to:
control the ECC circuit to sequentially read data corresponding to a first codeword from M sub-pages in the first memory cell row, perform error detection on the first codeword, and provide an error information based on the error detection, the error information indicating an error occurrence count in the first codeword, M being an integer greater than one; and
record the error information in the error information register and selectively determine, based on the error information, whether to write back a corrected first codeword in a memory location in which the data corresponding to the first codeword is stored.

* * * * *